United States Patent
Shibata et al.

(10) Patent No.: US 10,924,128 B2
(45) Date of Patent: Feb. 16, 2021

(54) VCO-BASED CONTINUOUS-TIME PIPELINED ADC

(71) Applicant: Analog Devices International Unlimited Company, Limerick (IE)

(72) Inventors: Hajime Shibata, Toronto (CA); Gerard E. Taylor, Laguna Niguel, CA (US); Wenhua W. Yang, Lexington, MA (US)

(73) Assignee: ANALOG DEVICES INTERNATIONAL UNLIMITED COMPANY, Limerick (IE)

( * ) Notice: Subject to any disclaimer, the term of this patent is extended or adjusted under 35 U.S.C. 154(b) by 0 days.

(21) Appl. No.: 16/422,579

(22) Filed: May 24, 2019

(65) Prior Publication Data

US 2020/0373934 A1    Nov. 26, 2020

(51) Int. Cl.
*H03M 1/06* (2006.01)
*H03M 1/10* (2006.01)
*H03M 1/12* (2006.01)

(52) U.S. Cl.
CPC ....... *H03M 1/1047* (2013.01); *H03M 1/0629* (2013.01); *H03M 1/1042* (2013.01); *H03M 1/1245* (2013.01)

(58) Field of Classification Search
CPC ............. H03M 1/1047; H03M 1/0629; H03M 1/1042; H03M 1/1245; H03M 1/12; H03M 3/30; H03M 7/3004
USPC .......................................... 341/118, 143, 155
See application file for complete search history.

(56) References Cited

U.S. PATENT DOCUMENTS

| | | | |
|---|---|---|---|
| 8,542,138 B2 | 9/2013 | Galton et al. | |
| 8,593,318 B2* | 11/2013 | Kaald | H03M 3/37 341/143 |
| 8,760,331 B2* | 6/2014 | Kaald | H03M 3/37 341/143 |
| 8,896,475 B2 | 11/2014 | Shibata | |
| 9,019,136 B2* | 4/2015 | Ho | H03M 3/32 341/143 |
| 9,312,840 B2 | 4/2016 | Dong et al. | |
| 9,432,045 B2 | 8/2016 | Shibata | |
| 9,641,190 B1* | 5/2017 | Braswell | H03M 1/1245 |

(Continued)

OTHER PUBLICATIONS

Taylor et al., *A Mostly Digital Variable-Rate Continuous-Time ADC ΔΣ Modulator*, ISSCC 2010, Session 16.4 High-Performance Data Converters, 2010 IEEE International Solid-State Circuits Conference © 2010 IEEE, 3 pages.

(Continued)

*Primary Examiner* — Jean B Jeanglaude
(74) *Attorney, Agent, or Firm* — Patent Capital Group

(57) ABSTRACT

VCO ADCs consume relatively little power and require less area than other ADC architectures. However, when a VCO ADC is implemented by itself, the VCO ADC can have limited bandwidth and performance. To address these issues, the VCO ADC is implemented as a back end stage in a VCO-based continuous-time (CT) pipelined ADC, where the VCO-based CT pipelined ADC has a CT residue generation front end. Optionally, the VCO ADC back end has phase interpolation to improve its bandwidth. The pipelined architecture dramatically improves the performance of the VCO ADC back end, and the overall VCO-based CT pipelined ADC is simpler than a traditional continuous-time pipelined ADC.

36 Claims, 17 Drawing Sheets

(56) References Cited

U.S. PATENT DOCUMENTS

| | | | |
|---|---|---|---|
| 9,762,221 | B2 | 9/2017 | Dong et al. |
| 9,768,793 | B2 | 9/2017 | Meng et al. |
| 9,774,344 | B2 | 9/2017 | Shibata |
| 9,838,031 | B2 | 12/2017 | Dong et al. |
| 1,017,110 | A1 | 1/2019 | Shibata et al. |
| 1,018,186 | A1 | 1/2019 | Patil et al. |
| 10,432,210 | B1* | 10/2019 | Yendluri ............... H03M 1/164 |
| 2012/0112936 | A1* | 5/2012 | Huang ................. H03M 1/502 341/110 |
| 2014/0368366 | A1 | 12/2014 | Galton et al. |
| 2015/0365098 | A1* | 12/2015 | Patil ..................... H03M 1/125 341/155 |

OTHER PUBLICATIONS

Taylor et al., *A Reconfigurable Mostly-Digital ΔΣ ADC with a Worst-Case FOM of 160dB*, 2012 Symposium on VLSI Circuits Digest of Technical Papers, 978-1-4673-0849-6, © 2012 IEEE, 2 pages.

Gerald E. Taylor, Dissertation, *Mostly Digital ADC's for Highly-Scaled CMOS Processes*, 2011, 130 pages.

Fishani et al., *True High-Order VCO-Based ADC*, Electronics Letters, Jan. 8, 2015, vol. 51, No. 1, 2 pages.

Sanyal et al., *A Hybrid SAR-VCO ΔΣ ADC with First-Order Noise Shaping*, 978-1-4799-3286-3/14 © 2014 IEEE, 5 pages.

Fishani, Dissertation, *High-Order VCO Based Delta Sigma Modulator*, University of Gent, 157 pages.

Ragab et al., *A 12b ENOB, 2.5MHz-BW, 4.8mW VCO-Based 0-1 MASH ADC with Direct Digital Background Nonlinearity Calibration*, 978-1-4799-8682-8/15 © 2015 IEEE, 4 pages.

Ragab et al., *A 12b ENOB, 2.5MHz-BW, VCO-Based 0-1 MASH ADC with Direct Digital Background Calibration*, IEEE Journal of Solid-State Circuits, © 2016 IEEE, 15 pages.

Yoon et al., *A 0.04-mm2 0.9-mW 71-dB SNDR Distributed Modular ΔΣ ADC with VCO-Based Integrator and Digital DAC Calibration*, 978-1-4799-8682-8/15 © 2015 IEEE, 4 pages.

Unpublished U.S. Appl. No. 16/028,002, filed Jul. 5, 2018.

Fishani et al., *A Mostly Digital VCO-Based CT-SDM with Third-Order Noise Shaping*, IEEE Journal of Solid-State Circuits, vol. 52, No. 8, Aug. 2017, 13 pages.

Sanyal et al., *A 18.5-fJ/step VCO-Based 0-1 MASH ΔΣ ADC with Digital Background Calibration*, 978-1-5090-0635-9-16 © 2015 IEEE, 2 pages.

Reddy et al., *A 16-mW 78-dB SNDR 10-MHz BW CTΔΣ ADC Using Residue-Cancelling VCO-Based Quantizer*, IEEE Journal of Solid-State Circuits, vol. 47, No. 12, Dec. 2012, 12 pages.

Taylor et al., *A Mostly-Digital Variable-Rate Continuous-Time Delta-Sigma Modulator ADC*, IEEE Journal of Solid State Circuits, vol. 45, No. 12, Dec. 2010, 13 pages.

Taylor et al., *A Reconfigurable Mostly-Digital Delta-Sigma ADC with a Worst-Case FOM of 160 dB*, IEEE Journal of Solid-State Circuits, vol. 48, No. 4, Apr. 2013, 13 pages.

Shibata et al., *A 9GS/s 1GHz-BW Oversampled Continuous-Time Pipeline ADC Achieving—161dBFS/Hz NSD*, ISSCC 2017, Session 16, Gigahertz Data Converters. 16.2. © 2017 IEEE, 3 pages.

Shibata et al., *A 9-GS/s 1.125-GHz BW Oversampling Continuous-Time Pipeline ADC Achieving—164-dBFS/Hz NSD*, IEEE Journal of Solid-State Circuits, vol. 52, No. 12, Dec. 2017, 16 pages.

EP Search Report issued in EP20170471.5 dated Sep. 28, 2020, 9 pages.

Siragusa et al., *Gain Error Correction Technique for Pipelined Analogue-to-Digital Converters*, in Electronics Letters, vol. 36, No. 7, pp. 617-618, Mar. 30, 2000, doi: 10.1049/el:20000501.

Dey et al., *A 50 MHz BW 76.1 dB DR Two-Stage Continuous-Time Delta-Sigma Modulator with VCO Quantizer Nonlinearity Cancellation*, IEEE Journal of Solid-State Circuits, vol. 53, No. 3, Mar. 2018, 15 pages.

\* cited by examiner

VCO-BASED CONTINUOUS-TIME PIPELINED ADC

TECHNICAL FIELD OF THE DISCLOSURE

The present disclosure relates generally to analog-to-digital converters (ADCs) and, more particularly, to voltage-controlled-oscillator (VCO) based continuous-time (CT) pipelined ADCs.

BACKGROUND

In many electronics applications, an analog input signal is converted to a digital output signal (e.g., for further digital signal processing). For instance, in precision measurement systems, electronics are provided with one or more sensors to make measurements, and these sensors may generate an analog signal. The analog signal would then be provided to an ADC as input to generate a digital output signal for further processing. In another instance, an antenna generates an analog signal based on the electromagnetic waves carrying information/signals in the air. The analog signal generated by the antenna is then provided as input to an ADC to generate a digital output signal for further processing.

ADCs can be found in many places such as broadband communication systems, audio systems, receiver systems, etc. ADCs can translate analog electrical signals representing real-world phenomena, e.g., light, sound, temperature or pressure for data processing purposes.

ADCs are used in a broad range of applications including Communications, Energy, Healthcare, Instrumentation and Measurement, Motor and Power Control, Industrial Automation and Aerospace/Defense. Designing an ADC is a non-trivial task because each application may have different needs in speed, performance, power, cost, and size. As the applications needing ADCs grow, the need for accurate and reliable conversion performance also grows.

ADCs are electronic devices that convert a continuous physical quantity carried by an analog signal to a digital number that represents the quantity's amplitude (or to a digital signal carrying that digital number). The conversion involves quantization of the analog input signal, so it would introduce a small amount of error. Typically the quantization occurs through periodic sampling of the analog input signal. The result is a sequence of digital values (i.e., a digital signal) that has converted a CT and continuous-amplitude analog input signal to a discrete-time and discrete-amplitude digital signal. An ADC can be defined by the following application requirements: its bandwidth (the range of frequencies of analog signals it can properly convert to a digital signal) and its resolution (the number of discrete levels the maximum analog signal can be divided into and represented in the digital signal). An ADC also has various specifications for quantifying ADC dynamic performance, including signal-to-noise-and-distortion ratio (SINAD), effective number of bits (ENOB), signal to noise ratio (SNR), signal to quantization noise ratio (SQNR), noise spectral density (NSD), total harmonic distortion (THD), total harmonic distortion plus noise (THD+N), and spurious free dynamic range (SFDR). ADCs have many different designs, which can be chosen based on the application requirements and performance specifications.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Overview

Figure 1:
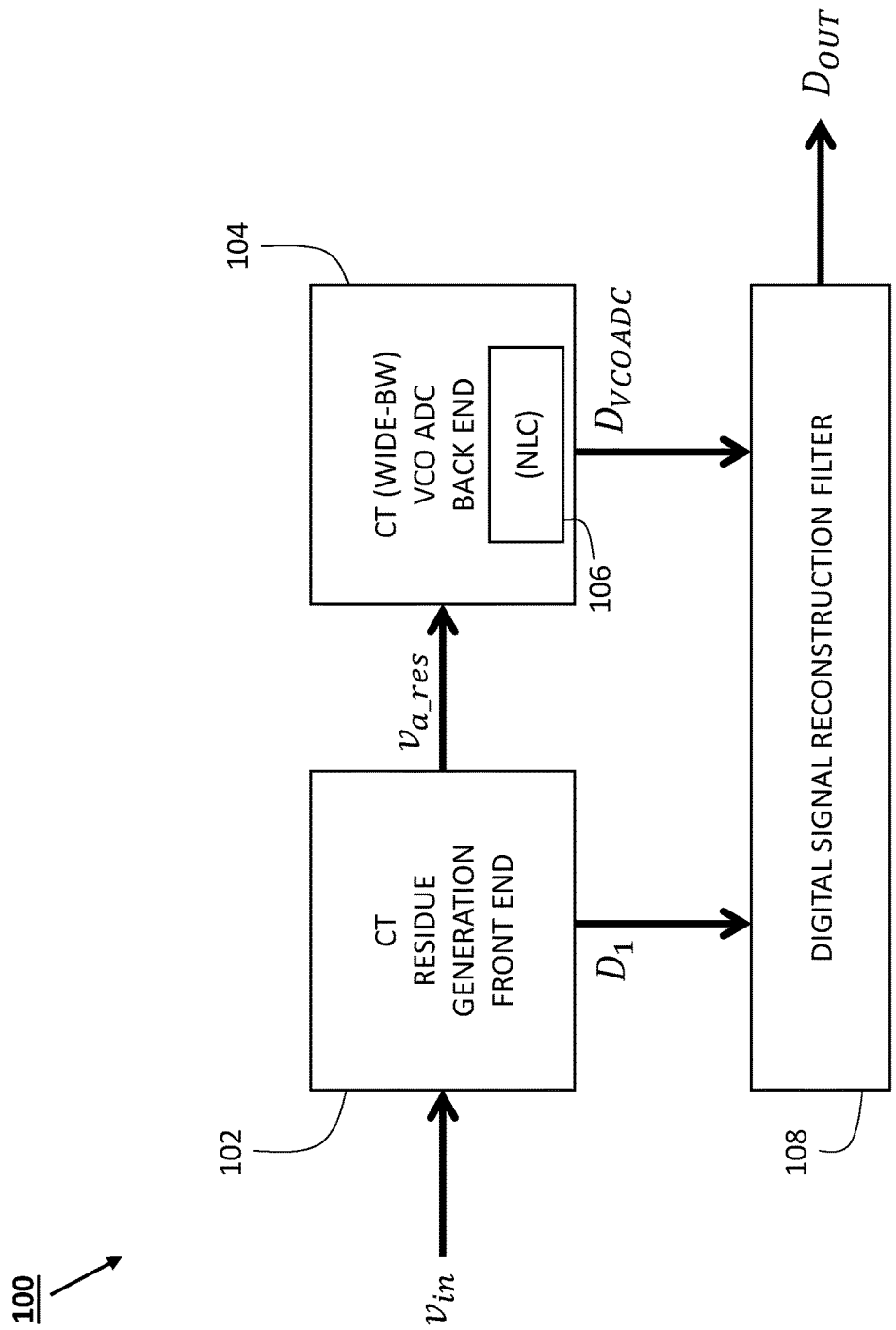
FIG. 1 is an illustrative system diagram of a VCO-based CT pipelined ADC having a CT residue generation front end and a CT VCO ADC back end, according to some embodiments of the disclosure.

VCO ADCs consume relatively little power and require less area than other ADC architectures. However, when a VCO ADC is implemented by itself, the VCO ADC can have limited bandwidth and performance. To address these issues, the VCO ADC is implemented as a back end stage in a VCO-based continuous-time (CT) pipelined ADC, where the VCO-based CT pipelined ADC has a CT residue generation front end. Optionally, the VCO ADC back end has phase interpolation to improve its bandwidth. The pipelined architecture dramatically improves the performance of the VCO ADC back end, and the overall VCO-based CT pipelined ADC is simpler than a traditional continuous-time pipelined ADC. Moreover, implementing the continuous-time pipelined ADC is not trivial. For instance, a unique digital signal reconstruction filter is implemented and programmed to combine digital signals of the continuous-time residue generation front end and the VCO ADC back end and generate a final digital output.

Limitations of a VCO ADC by Itself

A VCO ADC is a (mostly-digital) CT ADC. A VCO ADC comprises, in series: a ring oscillator, a phase-to-digital converter, and a differentiator. An analog input signal drives a ring oscillator, and the differentiator outputs a digital signal that is quantized version of the analog input signal.

The ring oscillator can include a voltage-controlled ring oscillator. For example, the ring oscillator can be implemented with an odd number of inverters connected in a ring. Each inverter can have a transition delay that depends on an input voltage to the ring oscillator. The ring oscillator can generate phase information of the analog input signal to the VCO ADC. In some cases, the voltage-controlled ring oscillator is implemented using a voltage-to-current converter followed by a current-controlled ring oscillator. The voltage-to-current converter converts an analog input voltage signal to into a current signal. Then, the current signal drives the current-controlled ring oscillator. The current-controlled ring oscillator can include an odd number of current-starved inverters in a ring.

The outputs of the inverters, which has phase information of the analog input signal to the VCO ADC, can be observed to derive the voltage of the analog input signal. Specifically, it is possible to extract the voltage of the analog input signal based on how the phase changes from one cycle to another cycle. The phase-to-digital converter can sample and quantize the phase of the VCO (e.g., the phase of the analog input signal to the VCO ADC). For instance, the phase-to-digital converter can include a ring sampler to sample the outputs of the inverters (e.g., observe transitions of the inverters), and a phase decoder to decode or map the outputs of the ring sampler into a phase number. The phase decoder generates a digital phase signal representative of the phase of the VCO. The digital phase signal is provided to a (digital) differentiator, which can have a transfer function of $1-z^{-1}$. The differentiator differentiates the digital phase signal and outputs a digital signal that is quantized version of the analog input signal to the VCO ADC.

The VCO ADC is low-power and compact-in-area, due to its simple circuit design. The ring oscillator is the analog circuit of the VCO ADC, whereas, other components which follow the ring oscillator are digital blocks. The resulting circuit of the VCO ADC, is compact since many analog circuits commonly-found in other ADCs such as flash ADCs, digital-to-analog converters (DACs), and amplifiers are not present in a VCO ADC. Instead, the VCO ADC only requires a ring oscillator, which can be implemented with simple, small complementary metal-oxide-semiconductor (CMOS) inverters. The digital blocks implemented in CMOS processes can be very compact, especially when the VCO ADC is implemented in smaller process nodes.

The VCO ADC can be considered as a type of CT ADC, because the analog input signal to the VCO ADC drives a ring oscillator that only has CT circuitry. In other words, the analog input signal to the VCO ADC is not sampled by samplers, i.e., the ring oscillator does not have switched-capacitor circuits which sample an input signal onto capacitor(s).

The VCO ADC, due to differentiation being used to derive the voltage of the analog input signal to the VCO ADC, has first-order noise shaping. This means that it is possible to implement a high resolution VCO ADC at or near DC (DC stands for direct current, where signal frequency is zero). However, the resolution is limited towards the sampling frequency of the VCO ADC, since the signal is difficult to observe at the sampling frequency.

Moreover, the ring oscillator has inherent and systematic non-linearity, even if the circuits in the ring oscillator is ideal. Specifically, converting an analog input signal into frequency to obtain phase information is a very non-linear process, and hurts the linearity of the entire VCO ADC. Accordingly, digital non-linearity correction is implemented to address the non-linearities. However, even with digital non-linearity correction, the achievable NSD, SNR, and SQNR are still limited for a VCO ADC.

Accordingly, the VCO ADC is usually applicable in applications where: (1) up to limited frequency (e.g., 1 MHz bandwidth), (2) NSD is >−150 dBFS/Hz, and/or (3) HD2 (second-order harmonics) or HD3 (third-order harmonics)>−80 dBFS. Many high speed, wide bandwidth applications cannot use a VCO ADC.

Limitations of a CT Pipelined ADC

CT pipelined ADC has N number of stages in cascade. For stage-1 to stage-N−1, each stage has a coarse ADC to generate a digital output signal, and circuitry to generate an amplified residue signal (which is an amplified difference between the analog input signal to the stage and a reconstructed analog input signal of the stage) to be processed by the following stage. Stage-N has an ADC, e.g., a flash ADC comprising a bank of comparators, to generate the last digital output signal. The digital output signals of all the stages are combined by a digital signal reconstruction filter to generate a final digital output signal. The stages have CT circuitry, and do not include samplers (e.g., switched-capacitor circuits).

When a large number of cascaded stages are implemented, e.g., N>2, the CT pipelined ADC can achieve low noise (e.g., NSD<−160 dBFS/Hz) and low distortion. It is common to implement 3 or more stages to achieve target performance. However, when the continuous-time pipelined ADC has a large number of cascaded stages, the circuitry can take up a significantly large amount of area in silicon, and consume a high amount of power. Moreover, a large number of cascaded stages can result in a complex digital signal reconstruction filter, if perfect signal reconstruction is to be achieved. For N stages in a CT pipelined ADC, N−1 finite impulse response (FIR) filters are typically implemented in a digital signal reconstruction filter. Accordingly, the more stages the CT pipelined ADC has, the more FIR filters are needed in the digital signal reconstruction filter.

A VCO-Based CT Pipelined ADC

When a CT pipelined ADC is implemented with a CT residue generation front end and a CT VCO ADC back end (referred herein as a VCO-based CT pipelined ADC), limitations of a VCO ADC and a CT pipelined ADC having many cascaded stages are alleviated. A VCO-based CT pipelined ADC differs from a CT pipelined ADC in that the back end of the VCO-based CT pipelined ADC is not implemented with a flash ADC, or a successive-approximation-register ADC. A VCO-based CT pipelined ADC implementing the CT residue generation front end and a CT VCO ADC back end unexpected benefits, advantages which are not present in a VCO ADC or in a CT pipelined ADC. Moreover, unique challenges arise when a CT residue generation front end is combined with a CT VCO ADC back end.

FIG. 1 is an illustrative system diagram of a VCO-based CT pipelined ADC 100 having a CT residue generation front end and a CT VCO ADC back end, according to some embodiments of the disclosure. The VCO-based CT pipelined ADC 100 includes: a CT residue generation front end 102, a CT VCO ADC back end 104, and a digital signal reconstruction filter 108. The CT residue generation front end 102 quantizes or digitizes an analog input signal uin and generate a first digital signal $D_1$ and an amplified residue signal $v_{a\_res}$. The CT VCO ADC back end 104 quantizes or digitizes the amplified residue signal and generate a second digital signal $D_{VCOADC}$. The digital signal reconstruction filter 108 filters the first digital signal $D_1$ and the second digital signal $D_{VCOADC}$ to generate a final digital signal $D_{OUT}$.

Optionally, the CT VCO ADC back end 104 includes a digital non-linearity correction block 106, to correct non-linearities of the CT VCO ADC back end 104 (or more specifically the VCO ADC 210). The digital non-linearity correction block 106 provides a corrected output as the second digital signal $D_{VCOADC}$ to the digital signal reconstruction filter 108.

First, the limitations such as non-linearity and noise of the CT VCO ADC back end 104 are alleviated by gain or amplification implemented in the CT residue generation front end 102. Specifically, the NSD of the CT VCO ADC back end 104 is suppressed by the gain of the CT residue generation front end 102. Note that the CT residue generation front end 102 cancels out a fundamental component of a large signal by generating a residue signal and providing an amplified residue signal $v_{a\_res}$ to the CT VCO ADC back end 104. As a result, the distortion introduced by the CT VCO ADC back end 104 processing the amplified residue signal $v_{a\_res}$ is limited or reduced. Therefore, the VCO-based CT pipelined ADC 100 can be designed so that the NSD of the CT residue generation front end 102 dominates the overall NSD. This means that the VCO-based CT pipelined ADC 100 can achieve a same NSD as a CT pipeline ADC, and the poor NSD of a VCO ADC by itself would not be a limiting factor in the design of the VCO-based CT pipelined ADC 100.

Second, using a CT VCO ADC back end 104, which can have relatively high resolution compared to a stage-N of a CT pipelined ADC, means that the number of stages and design complexity in the VCO-based CT pipelined ADC 100 can be reduced while still be able to achieve the same resolution as a CT pipelined ADC. As a result, limitations associated with a CT pipelined ADC having many stages, such as area overhead, digital signal reconstruction filter complexity, and higher power consumption, are alleviated by implementing a VCO-based CT pipelined ADC 100 that has fewer pipelined stages for the same target resolution, and simpler circuitry due to the smaller and simpler circuit design of the CT VCO ADC back end 104. Put simply, the VCO-based CT pipelined ADC 100, when compared to a CT pipelined ADC with the same target resolution, can have lower power, smaller silicon area, and less-complicated digital signal processing (i.e., processing in the digital signal reconstruction filter).

Third, the CT VCO ADC back end 104 provides a sinc response, whereas a flash ADC of at the end of a CT pipeline ADC does not have a sinc response. The sinc response of the CT VCO ADC back end 104 can provide additional anti-aliasing benefits.

The VCO-based pipelined ADC 100 and other embodiments herein have additional benefits over other ADC architectures, which will be explained in greater detail herein.

Figure 2:
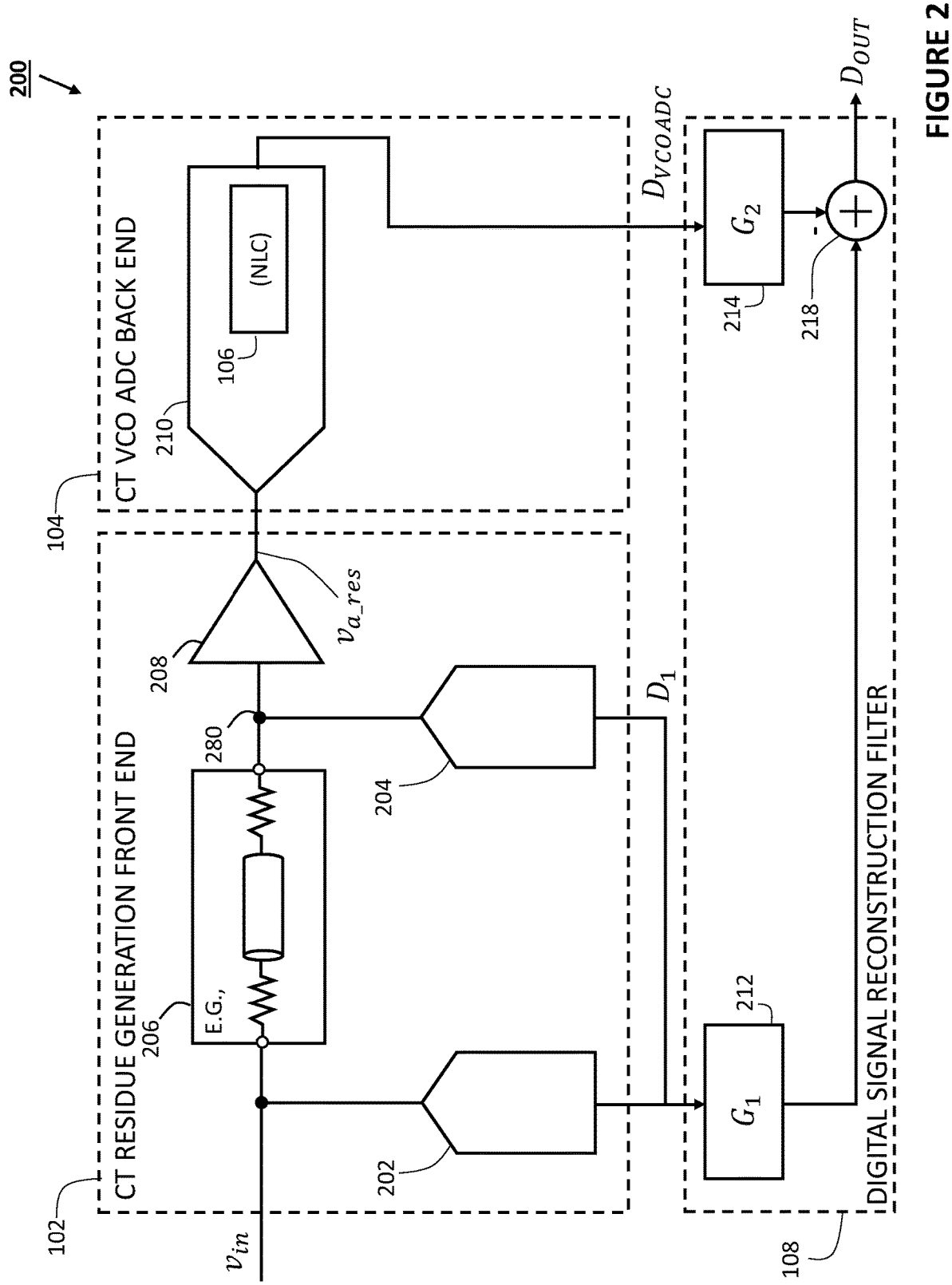
FIG. 2 shows an exemplary implementation of a VCO-based CT pipelined ADC having a CT residue generation front end and a CT VCO ADC back end, according to some embodiments of the disclosure.

FIG. 2 shows an exemplary implementation of a VCO-based CT pipelined ADC 200 having a CT residue generation front end 102 and a CT VCO ADC back end 104, according to some embodiments of the disclosure. The CT residue generation front end 102 can include a quantizer 202, a DAC 204, a delay circuit 206, node 280, and a residue amplifier 208. The CT VCO ADC back end 104 can include a VCO ADC 210. The VCO ADC 210 optionally includes a digital non-linearity correction block 106. The digital signal reconstruction filter 108 can include a first filter 212, a second filter 214, and a node 218.

The quantizer 202 receives the analog input signal $v_{in}$ and generates the first digital signal $D_1$ by performing analog-to-digital conversion. The quantizer 202 can be an ADC, such as a flash ADC comprising a bank of comparators to compare the analog input signal $v_{in}$ against a plurality of reference voltages. The first digital signal $D_1$ is provided to digital signal reconstruction filter 108.

The DAC 204 receives the first digital signal $D_1$ and generate a first reconstructed analog signal at an output of DAC 204 by performing digital-to-analog conversion. The DAC 204 reconstructs the analog input signal $v_{in}$ by generating the first reconstructed analog signal based on the first digital signal $D_1$. DAC 204 can be a current-mode DAC generating a current signal, or a voltage-mode DAC generating a voltage signal.

The delay circuit 206 delays a first analog input signal to the quantizer 202, e.g., the analog input signal $v_{in}$, and generates a first delayed analog input signal. A response of the delay circuit 206 preferably matches a response of a signal path having the quantizer 202 and the DAC 204. Details and illustrative examples of the delay circuit 206 are provided in FIGS. 4-10 and 20-21, and the passages that describe FIGS. 4-10 and 20-21.

Node 280 can perform subtraction/differencing to output a residue signal representing a difference between the first delayed analog input signal from the delay circuit 206 and the first reconstructed analog signal from DAC 204. The first residue signal ideally represents a quantization error of quantizer 202. Node 280 can perform voltage-mode subtraction or current-mode subtraction.

The residue amplifier 208 amplifies the residue signal from node 280 and generate the amplified residue signal $v_{a\_res}$. The residue amplifier 208 can apply a gain that is greater than 1 to the first residue signal generated by node 280. In some cases, the residue amplifier 208 is a filter having a filtering response, e.g., the residue amplifier 208 can have dynamic characteristics. This means that the amplified residue signal $v_{a\_res}$ cane a filtered residue signal. In some cases, the gain being applied may not be exactly the same or may not be uniform across frequencies. Accordingly, the residue amplifier 208 perform a filtering function (in addition to applying gain the first residue signal generated by node 280). In some embodiments, the residue amplifier 208 has a low pass response. In some embodiments, the residue amplifier 208 has a high-pass response. In some embodiments, the residue amplifier 208 has a band-pass response. In some embodiments, the residue amplifier 208 has a first-order response. In some embodiments, the residue amplifier 208 has a second-order or higher-order response.

VCO ADC 210 receives and processes the amplified residue signal $v_{a\_res}$. VCO ADC 210 can quantize the amplified residue signal $v_{a\_res}$. The (optional) digital non-linearity correction block 106 can correct non-linearities of the VCO ADC 210. The digital non-linearity correction block 106 provides a corrected output as the second digital signal $D_{VCOADC}$ to the digital signal reconstruction filter 108.

The first filter 212 (shown as $G_1$) of the digital signal reconstruction filter 108 can filter the first digital signal $D_1$. The second filter 214 (shown as $G_2$) of the digital signal reconstruction filter 108 can filter the second digital signal $D_{VCOADC}$. Node 218 can combine outputs of the first filter 212 and the second filter 214 to generate the digital signal $D_{OUT}$. Details and illustrative examples of the digital signal reconstruction filter 108 are provided in FIG. 3 and the passages that describe FIG. 3.

Digital Signal Reconstruction Filter

The digital signal reconstruction filter 108 is unique to the VCO-based CT pipelined ADC. Moreover, the digital signal reconstruction filter 108 is not trivial, because the implementation and behavior of CT circuitry in the VCO-based CT pipelined ADC can complicate digital signal reconstruction. The behavior or response of the CT circuitry is hidden.

One technical task of the digital signal reconstruction filter 108 is to remove the quantization noise introduced by the CT residue generation front end 102, specifically, the quantization noise introduced by quantizer 202. When the digital signal reconstruction filter 108 is programmed appropriately, the quantization noise introduced in the CT residue generation front end 102 can be cancelled out in the final digital signal $D_{OUT}$. Suppose:

the circuitry in CT residue generation front end 102 that generates the residue signal (prior to amplification by the residue amplifier 208) has a signal transfer function $STF_{CTRES}$, noise transfer function $NTF_{CTRER}$, and quantization noise $q_{CTRES}$, the residue amplifier 208 that amplifies the residue signal to generate the amplified residue signal has a signal transfer function $STF_{RA}$, the CT VCO ADC back end 104 has a signal transfer function $STF_{VCOADC}$, noise transfer function $NTF_{VCOADC}$, and quantization noise $q_{VCOADC}$, the transfer function of the first filter 212 is $G_1$, and
the transfer function of the second filter 214 is $G_2$.

The signal processing in the digital signal reconstruction filter 108 in FIG. 2, can be characterized as follows:

$$D_{OUT} = D_1 \cdot G_3 - D_{VCOADC} \cdot G_2 \quad \text{(eq. 1)}$$

Also, $D_1$ and $D_{VCOADC}$ can be characterized by the transfer functions mentioned above, as follows:

$$D_1 = v_{in} \cdot STF_{CTRES} + q_{CTRES} \cdot NTF_{CTRES} \quad \text{(eq. 2)}$$

$$D_{VCOADC} = q_{CTRES} \cdot STF_{RA} \cdot STF_{VCOADC} + Q_{VCOADC} \cdot NTF_{VCOADC} \quad \text{(eq. 3)}$$

Plugging in Equations 2 and 3 into Equation 1 results in:

$$D_{out} = \{v_{in} \cdot STF_{CTRES} + q_{CTRES} \cdot NTF_{CTRES}\} \cdot G_1 - \quad \text{(eq. 4)}$$
$$\{q_{CTRES} \cdot STF_{RA} \cdot STF_{VCOADC} + q_{VCOADC} \cdot NTF_{VCOADC}\} \cdot G_2 =$$
$$v_{in} \cdot STF_{CTRES} \cdot G_1 + q_{CTRES} \cdot NTF_{CTRES} \cdot G_1 -$$
$$q_{CTRES} \cdot STF_{RA} \cdot STF_{VCOADC} \cdot G_2 + q_{VCOADC} \cdot NTF_{VCOADC} \cdot G_2$$

Note that the terms having the quantization noise $q_{CTRES}$ (introduced by the CT residue generation front end 102) can be cancelled out (or goes to zero) if:

$$q_{CTRES} \cdot NTF_{CTRES} \cdot G_1 = q_{CTRES} \cdot STF_{RA} \cdot STF_{VCOADC} \cdot G_2 \quad \text{(eq. 5)}$$

Rewriting Equation 5 yields:

$$\frac{G_1}{G_2} = \frac{q_{CTRES} \cdot STF_{RA} \cdot STF_{VCOADC}}{q_{CTRES} \cdot NTF_{CTRES}} = \frac{STF_{RA} \cdot STF_{VCOADC}}{NTF_{CTRES}} \quad \text{(eq. 6)}$$

This means that if the ratio of the first filter 212 (i.e., the transfer function $G_1$) and the second filter 214 (i.e., the transfer function $G_2$) corresponds to (1) a signal transfer function $STF_{RA}$ of a residue amplifier generating the amplified residue signal, (2) a signal transfer function $STF_{VCOADC}$ of the VCO ADC back end, and (3) a noise transfer function $NTF_{CTRES}$ of the CT residue generation front end 102, terms having the quantization noise $q_{CTRES}$ would be cancelled out in the final digital output $D_{OUT}$. Specifically, if the ratio $$\frac{G_1}{G_2}$$

satisfied Equation 6, then terms having the quantization noise $q_{CTRES}$ would be cancelled out and not appear in the final digital output $D_{OUT}$.

Within the disclosure, "a ratio corresponds to (multiple functions)" means that X has a correspondence to, matches, or is associated with one or more of: {multiple functions}. The correspondence may not be exact. The correspondence may be an approximation. In some cases, the ratio can be composed of one or more of: {multiple functions}, in some form, or in a suitable combination.

The design of the digital signal reconstruction filter 108, according to Equation 6, thus sets a constraint on the ratio: $G_1/G_2$, however, the design does not prescribe the specific responses of the first filter and the second filter (i.e., $G_1$ and $G_2$). Several possible solutions exist for $G_1$ and $G_2$ that would satisfy Equation 6.

In some cases, $G_1 = STF_{RA} \cdot STF_{VCOADC}$ and $G_2 = NTF_{CTRES}$.

In some cases, $G_1 = NTF_{CTRES}$ and $G_1 = NTF_{CTRES}/STF_{RA} \cdot STF_{VCOADC}$.

Note that because of the architecture of the CT residue generation front end 102, there is no noise shaping in the CT residue generation front end 102. Accordingly, $NTF_{CTRES} = 1$, or the noise transfer function $NTF_{CTRES}$ of the CT residue generation front end 102 can be approximated as 1 (e.g., the noise transfer function $NTF_{CTRES}$ of the CT residue generation front end 102 has a flat frequency response). Equation 6 thus becomes:

$$\frac{G_1}{G_2} = \frac{q_{CTRES} \cdot STF_{RA} \cdot STF_{VCOADC}}{q_{CTRES}} = STF_{RA} \cdot STF_{VCOADC} \quad \text{(eq. 7)}$$

In some cases, $G_1 = STF_{RA} \cdot STF_{VCOADC}$ and $G_2 = 1$.
In some cases, $G_1 = 1$ and $G_2 = 1/STF_{RA} \cdot STF_{VCOADC}$.

This means that if the ratio of the first filter 212 (i.e., the transfer function $G_1$) and the second filter 214 (i.e., the transfer function $G_2$) corresponds to (1) a signal transfer function $STF_{RA}$ of a residue amplifier generating the amplified residue signal, and (2) a signal transfer function $STF_{VCOADC}$ of the VCO ADC back end.

Another technical task is that the digital signal reconstruction filter 108 can ensure that the first digital signal $D_1$ does not contribute to the final digital output $D_{OUT}$. That means that the digital signal reconstruction filter 108 can reconstruct the analog input signal $v_{in}$ and form the final converter final digital signal $D_{OUT}$ based on the digital signals (e.g., first digital signal $D_1$ and second digital signal $D_{VCOADC}$), in a manner such that the final digital signal $D_{OUT}$ is accurately represents the analog input signal $v_{in}$.

In some embodiments, the digital signal reconstruction filter 108 can enable equal and opposite signal paths for the first digital signal $D_1$ towards the final digital output $D_{OUT}$. The digital signal reconstruction filter 108 can ensure that the contribution from the first digital signal $D_1$ is cancelled out in the final digital output $D_{OUT}$ when the results from the equal and opposite signal paths are summed. The first filter 212, which has a transfer function $G_1$, provides a first signal path for the first digital signal $D_1$ towards the final digital output $D_{OUT}$. The second filter 214, which has a transfer function $G_2$, is a part of a second and opposite signal path for the first digital signal $D_1$ towards the final digital output $D_{OUT}$. Specifically, the second and opposite signal path includes DAC 204, the residue amplifier 208, the CT VCO ADC back end 104, and the second filter 214. Suppose the transfer function relating the first digital signal $D_1$ and the second digital signal $D_{VCOADC}$ is characterized by $G_1/G_2$, then the transfer function of the second and opposite signal path for the first digital signal $D_1$ towards the final digital output $D_{OUT}$ is a combination of $G_1/G_2$ and $-G_1$ (the negative sign originates from the subtraction in node 218), i.e., $\{G_1/G_2\} \cdot -G_2 = -G_1$. That means that the transfer function the first signal path is equal and opposite of the transfer function of the second and opposite signal path, i.e., $G_1$ is equal and opposite of $-G_1$. Accordingly, the contribution from first digital signal $D_1$ is cancelled out and removed from the final digital output $D_{OUT}$ after the outputs of the first filter 212 and the second filter 214 are combined at node 218. Phrased differently, the first digital signal $D_1$ does not contribute to the reconstructed final digital output Dour. It can be appreciated that the transfer function relating the first digital signal $D_1$ and the second digital signal $D_{VCOADC}$ can be characterized by $G_1/G_2$, e.g., when $G_1=STF_{VCOADC} \cdot STF_{RA}$ and $G_2=1$. The first digital signal $D_1$ and the second digital signal $D_{VCOADC}$ are connected by a signal path having the DAC 204, the residue amplifier 208, and the CT VCO ADC back end 104. Accordingly, the transfer function relating the first digital signal $D_1$ and the second digital signal $D_{VCOADC}$ can be represented by a combination of a signal transfer function $STF_{RA}$ of the residue amplifier 208 and a signal transfer function $STF_{VCOADC}$ of the CT VCO ADC back end 104.

In practice, the first filter 212 (having the transfer function $G_1$) and the second filter 214 (having the transfer function $G_2$) are digital filters which are programmed using digital, approximate versions of the actual transfer functions. Determining the digital versions of the transfer functions is not a trivial task for VCO-based CT pipelined ADCs, since the transfer functions of CT circuitry are hidden and may not be well-characterized. Moreover, if the digital versions of the actual transfer functions do not accurately match with the actual versions of the transfer functions, quantization noise leakage can occur:

$$D_{out} = \{v_{in} \cdot STF_{CTRES} + q_{CTRES} \cdot NTF_{CTRES}\} \cdot G_1 - \quad (eq. 8)$$
$$\{q_{CTRES} \cdot STF_{RA} \cdot STF_{VCOADC} + q_{VCOADC} \cdot NTF_{VCOADC}\} \cdot G_2 =$$
$$v_{in} \cdot STF_{CTRES} \cdot DSTF_{VCOADC} \cdot DSTF_{RA} +$$
$$q_{CTRES} \cdot NTF_{CTRES} \cdot DSTF_{VCOADC} \cdot DSTF_{RA} -$$
$$q_{CTRES} \cdot STF_{RA} \cdot STF_{VCOADC} \cdot DNTF_{CTRES} +$$
$$q_{VCOADC} \cdot NTF_{VCOADC} \cdot DNTF_{CTRES}$$

Note that the terms with the quantization noise $q_{CTRES}$ of the CT residue generation front end 102 do not cancel out if $DSTF_{VCOADC} \neq STF_{VCOADC}$, $DSTF_{RA} \neq STF_{RA}$, and $DNTF_{CTRES} \neq NTF_{CTRES}$.

Figure 3:
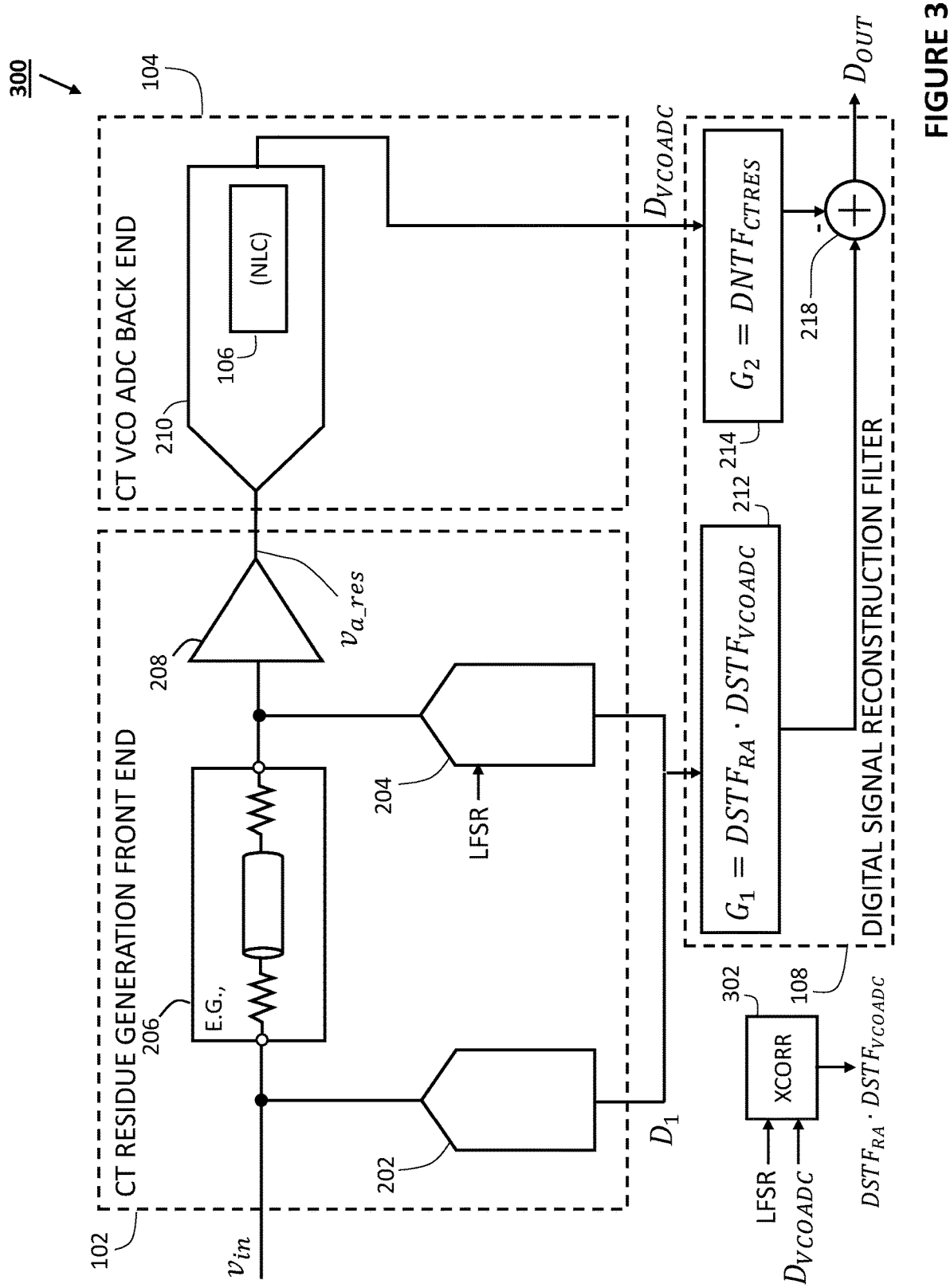
FIG. 3 illustrates an exemplary digital signal reconstruction filter and a scheme for programming the digital signal reconstruction filter, according to some embodiments of the disclosure.

FIG. 3 illustrates an exemplary digital signal reconstruction filter 108 and a scheme for programming the digital signal reconstruction filter 108, according to some embodiments of the disclosure. The technical task of programming the first filter 212 (and/or the second filter 214) is to determine digital filters, which can efficiently process the first digital signal $D_1$ and the second digital signal $D_{VCOADC}$ in the digital domain. In the example shown, the first filter 212 (i.e., the transfer function $G_1$) can correspond to the digital version of the digital version of the signal transfer function of the residue amplifier 208 ($DSTF_{RA}$) and the digital version of the signal transfer function of the CT VCO ADC back end 104 ($DSTF_{VCOADC}$):

$$G_1 = DSTF_{RA} \cdot VDSTF_{VCOADC} \quad (eq. 9)$$

The second filter 214 (i.e., the transfer function $G_2$) can correspond to a digital version of the noise transfer function of the CT residue generation front end 102 ($DNTF_{CTRES}$):

$$G_2 = DNTF_{CTRES} \approx 1 \quad (eq. 10)$$

The signal transfer functions of the VCO-based CT pipelined ADC 300 as seen in Equation 9 are not always well defined, and can change over time during operation or can vary from one integrated circuit to another. To determine the digital version of the signal transfer function of the residue amplifier and the digital version of the signal transfer function of the CT VCO ADC back end 104, i.e., $DSTF_{RA}$ and $DSTF_{VCOADC}$, and a known signal or dither can be injected at the input of the residue amplifier 208. The known signal or dither can be removed from the second digital signal $D_{VCOADC}$ in the digital domain. Information about the signal transfer functions can be extracted by observing how the known signal is affected by the signal path.

For example, the known signal or dither can be a maximum length linear feedback shift registers (LFSR) sequence, whose cross-correlation approaches an impulse response. Direct cross-correlation between the injected maximum length LFSR sequence and the second digital signal $D_{VCOADC}$ can be performed in the background to estimate the signal transfer function of the residue amplifier 208 and the signal transfer function of the CT VCO ADC back end 104 and obtain $DSTF_{RA}$ and $DSTF_{VCOADC}$.

Cross-correlation, as used herein, refers to a measurement of similarity between a pair of signals:

$$r_{xy}[l] = \sum_{n=-\infty}^{\infty} x[n]y[n-l]$$

L indicates lag, and n is the time index. Accordingly, the cross-correlation is the accumulation of signal multiplications in time, equivalent to the convolution of x[n] with y[-n], or multiplication $r_{xy}[l] = \mathcal{F}^{-1}\{X[k] \cdot Y^*[k]\}$ where k is frequency. Cross-correlation is a sliding dot product or sliding inner-product of the two digital signals.

One-bit dither generated through a maximum length LFSR sequence can be injected at an input of the residue amplifier 208. Referring to FIG. 3, the dither LFSR can be injected in the DAC 204 (e.g., by adding the dither to the output of the DAC 204, or by modifying input bits to the DAC 204 based on the dither to cause the dither to be added to the output of the DAC 204). The dither LFSR can be removed in the digital domain, e.g., from the second digital signal $D_{VCOADC}$.

The CT pipelined ADC 300 further includes a correlator 302 to cross-correlate the dither and the second digital signal $D_{VCOADC}$ to extract (1) a signal transfer function of a residue amplifier 208 generating the amplified residue signal, and (2) a signal transfer function of the CT VCO ADC back end 104. Specifically, the result of cross-correlation by correlator 302 can yield estimates or approximations of the signal transfer function of the residue amplifier 208 and the CT VCO ADC back end 104, i.e., $\text{DSTF}_{RA} \cdot \text{DSTF}_{VCOADC}$. The estimates/approximations corresponding to $\text{DSTF}_{VCOADC} \cdot \text{DSTF}_{RA}$, can be used to program the first filter 212 and/or the second filter 214. The estimates/approximations includes information to program coefficients for taps of a FIR filter in the digital signal reconstruction filter 108.

Note that the digital signal reconstruction filter 108 in FIG. 3 can be realized with just a single FIR filter (e.g., when one of the first filter 212 and the second filter 214 has a response of 1). This means that the digital signal reconstruction filter 108 can be implemented efficiently. For instance, one of the first filter 212 and the second filter 214 can be a 7-tap FIR filter.

By taking into account the signal transfer function (e.g., sinc response) of the CT VCO ADC back end 104 in the digital signal reconstruction filter 108, a significant amount of distortion is removed in the final digital output Dour.

Other types of signals can be used as the known signal or dither, and other mechanisms (depending on the type of signal being used) can be implemented to extract the signal transfer function. For instance, a pseudo-random signal, such as a pseudo-random 1-bit sequence, can be used as the known signal or dither. The known signal or dither can be white noise over a range of frequencies, such as one or more Nyquist zones of converter. The known signal can include tones sweeping over a range of frequencies, such as one or more Nyquist zones of the converter. Preferably, the known signal or dither has energy or information content over a range of frequencies (e.g., a wideband signal). Using a known signal with wideband energy or information content can ensure that the signal transfer function over a frequency range of interest can be extracted. In some cases, the behavior of the signal path can be more critical in lower frequencies, and accordingly, the known signal or dither may have more energy or information content in the lower frequencies of the frequency range of interest, so that the signal transfer function being extracted has more information about the behavior of signal path in the lower frequencies.

Cross-correlation represents one exemplary signal transfer function extraction scheme. Other extraction schemes suitable for a particular kind of known signal being injected can be used to extract the signal transfer function(s) of interest. For instance, if the known signal comprises tones sweeping over a range of frequencies, magnitude and phase information corresponding to various frequencies, extracted from the digital outputs generated as a result of tones at various frequencies, can be used to form the signal transfer function(s) of interest.

Delay Circuit Matching the Signal Path Having the Quantizer and the DAC

The residue signal at the input of the residue amplifier 208 represents a difference between the analog input signal $v_{in}$ and the reconstructed analog input signal from DAC 204. To ensure that the residue signal generated by node 280 accurately represents a difference between the analog input signal $v_{in}$ and the reconstructed analog output signal at the output of DAC 204, the analog input signal $v_{in}$ is at least delayed by a same amount of time it takes for the analog input signal vLn to propagate and be processed by the quantizer 202 and DAC 204. Accordingly, the delay circuit 206 of FIGS. 2 and 3, delays the analog input signal in $v_{in}$ (the input to the quantizer 202), and generates a delayed analog input signal. The delay would match a propagation delay of the signal path having the quantizer 202 and DAC 204.

Figure 4:
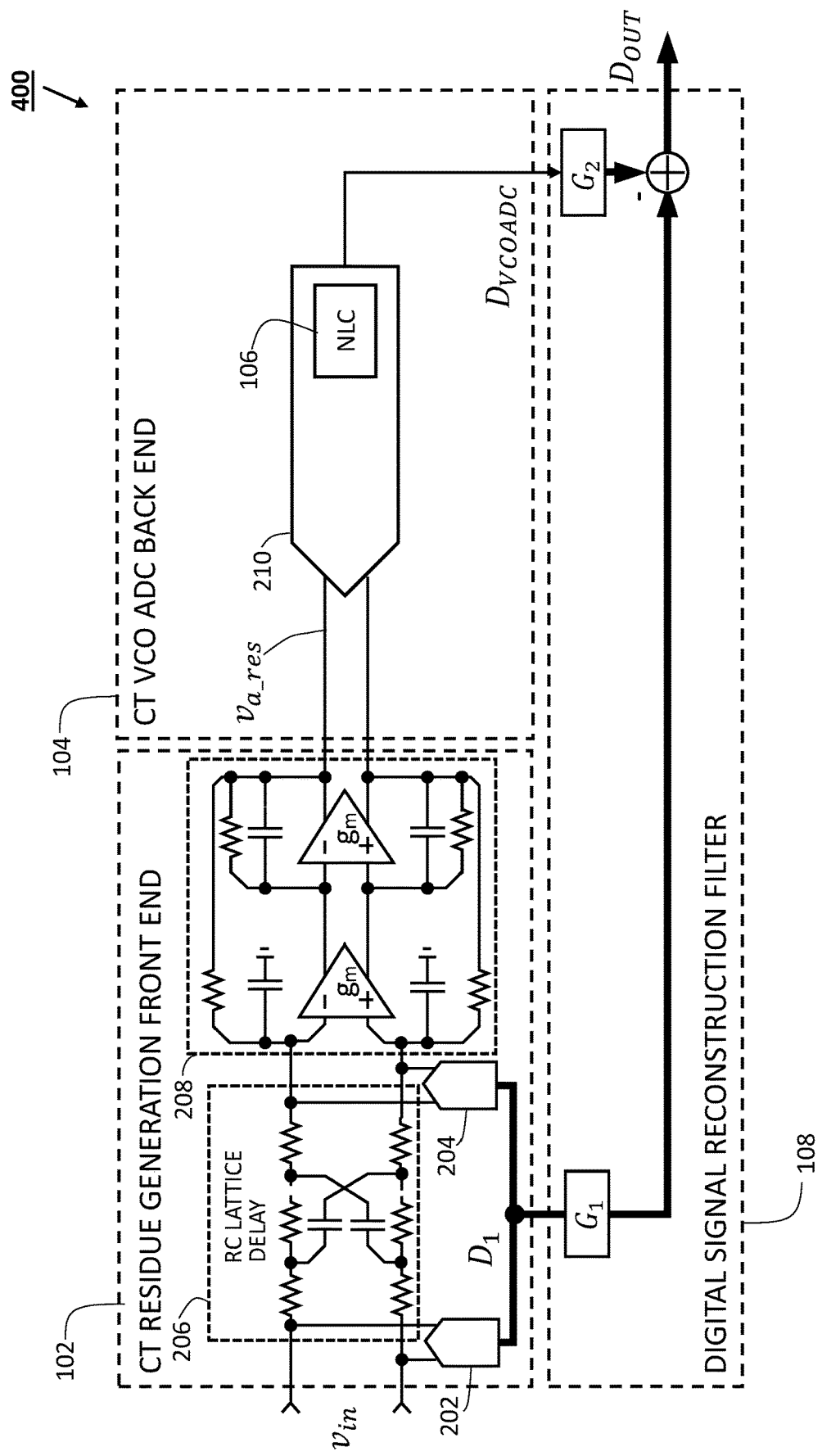
FIG. 4 shows an exemplary implementation of a VCO-based CT pipelined ADC having a CT residue generation front end and a CT VCO ADC back end, according to some embodiments of the disclosure.

Besides matching the delay, the delay circuit 206 preferably also matches the response (e.g., frequency response) of the signal path having the input the quantizer 202 and DAC 204 forms a signal path from the analog input signal $v_{in}$. For instance, the delay circuit 206 can match the magnitude and/or phase of the signal path. To achieve matching of magnitude, phase, and/or any other desirable response characteristics, the delay circuit 206 can be implemented using a variety of analog/CT circuits. FIG. 4 shows an exemplary implementation of a VCO-based CT pipelined ADC 400 having a CT residue generation front end 102 and a CT VCO ADC back end 104, according to some embodiments of the disclosure. The delay circuit 206 in the CT residue generation front end 102 comprises a resistor-capacitor lattice circuit.

Figure 5:
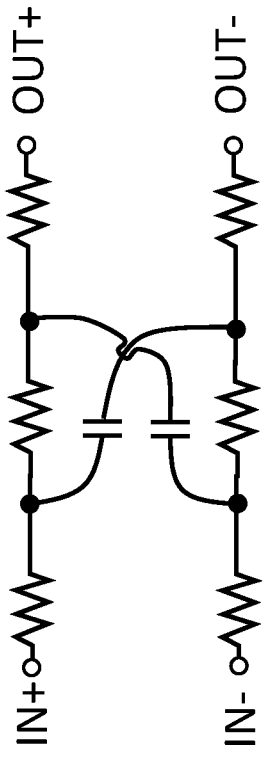
FIGS. 5-10 illustrate various implementations of CT delay lines, according to some embodiments of the disclosure.
Figure 6:
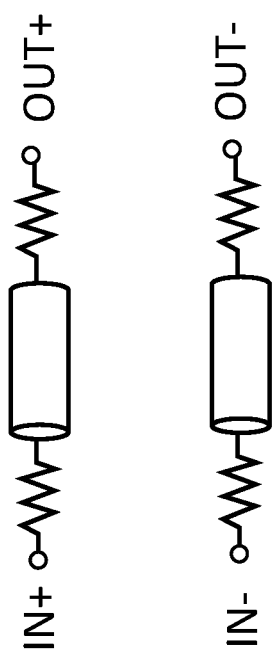
Figure 7:
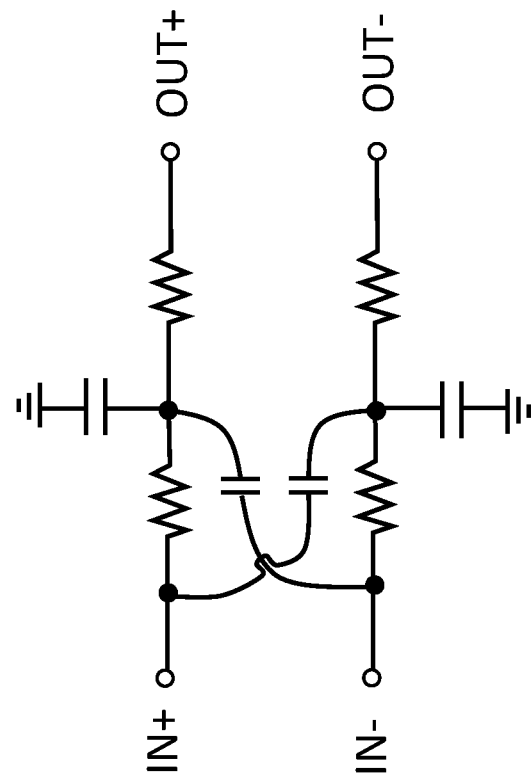
Figure 8:
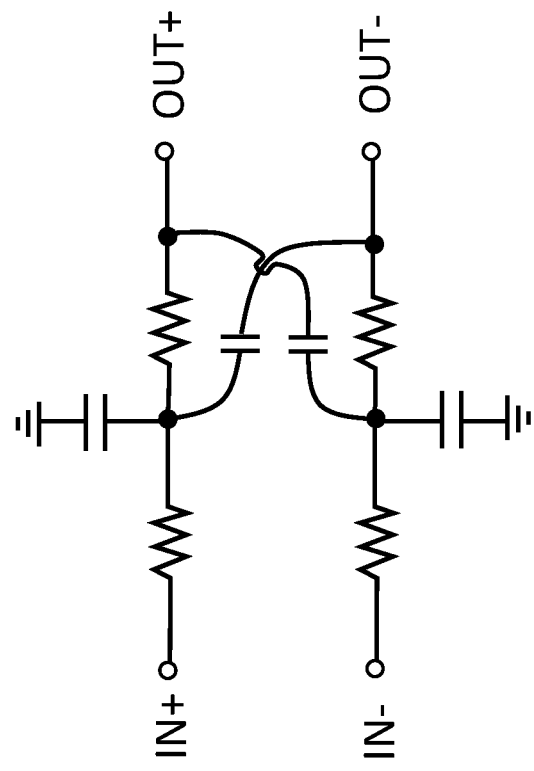
Figure 9:
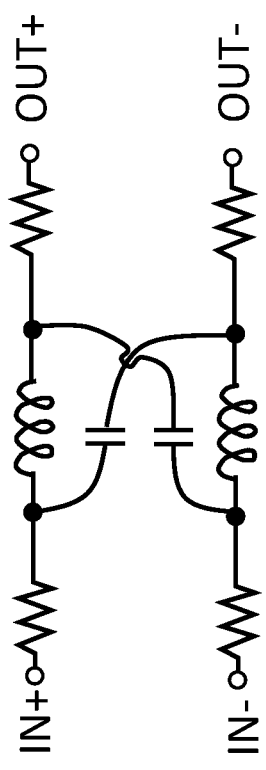
Figure 10:
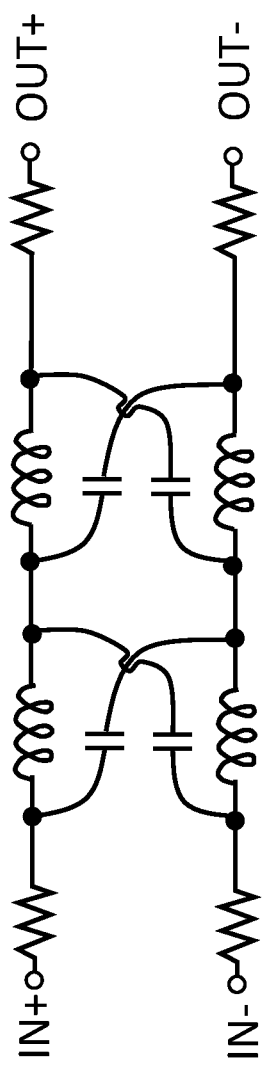

FIGS. 5-10 illustrates various exemplary implementations of the delay circuit 206. FIG. 5 shows a delay circuit implemented based on resistors and transmission lines (e.g., a conductor). FIG. 6 shows a delay circuit comprising a resistor-capacitor lattice, as seen in FIG. 4. FIGS. 7 and 8 illustrate variations on the resistor-capacitor lattice circuit. FIG. 9 shows a delay circuit comprising an inductor-capacitor lattice. FIG. 10 shows a delay circuit comprising cascaded inductor-capacitor lattices. Different circuit implementations of the delay circuit can implement different (filtering) responses (i.e., magnitude and phase can differ depending on the circuit and the values of the circuit components). The specific implementation of the delay circuit 206 can depend on the implementations of the signal path having the quantizer 202 and DAC 204, and the desired level of matching between the delay circuit 206 and the signal path. In some cases, the magnitude matching between the delay circuit 206 and the signal path having the quantizer 202 and DAC 204 is provided by implementing a delay circuit 206 that has a low pass filtering response.

Figure 20:
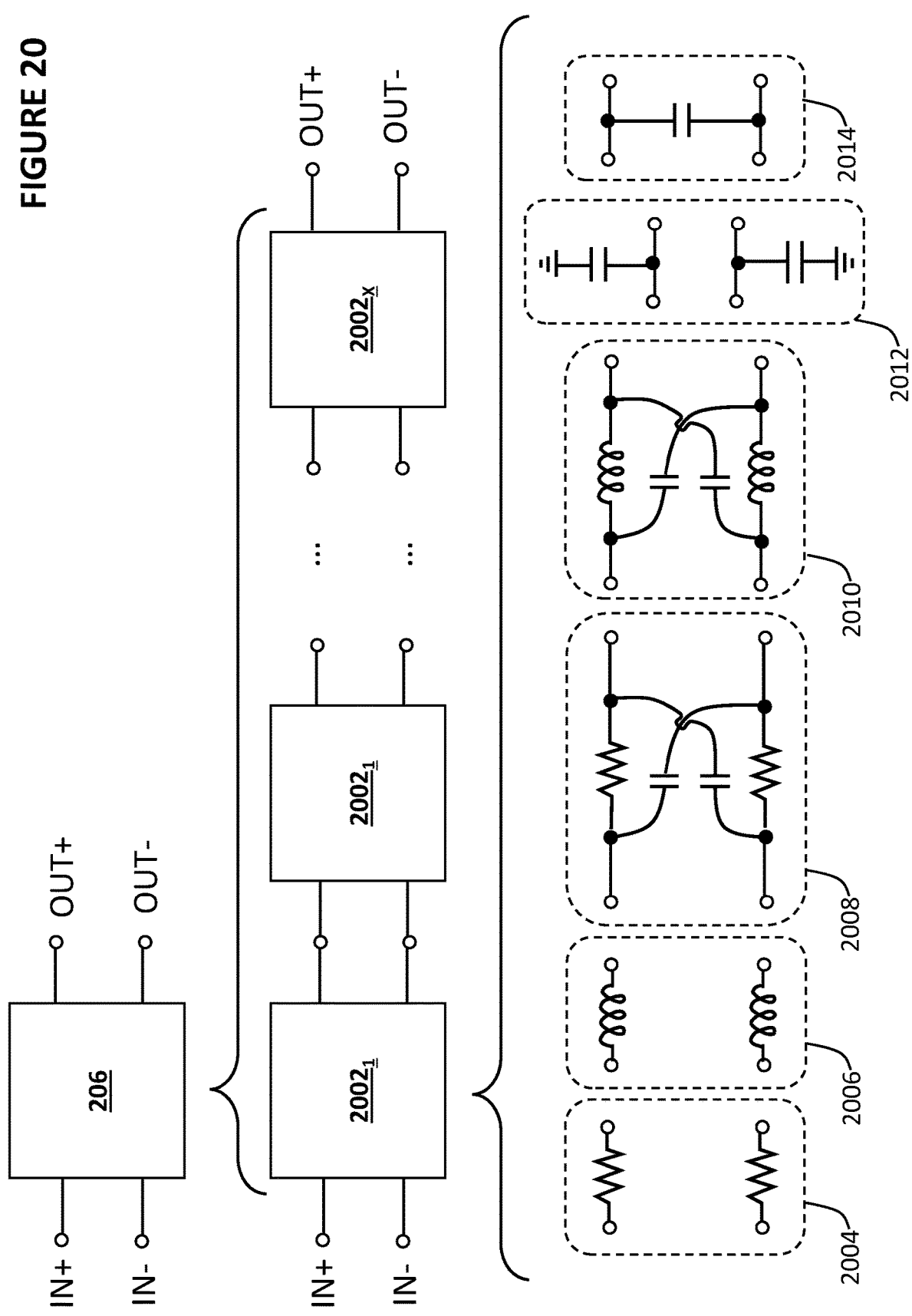
FIG. 20 illustrates various implementations of CT delay lines, according to some embodiments of the disclosure.

FIG. 20 illustrates various implementations of CT delay lines, according to some embodiments of the disclosure. The construction and design of the delay circuit 206 can be modular, and the parts of the delay circuit 206 can be selected to optimize the matching of the delay circuit 206 with the signal path having the quantizer 202 and DAC 204. Specifically, the parts of the delay circuit 206 can be chosen for factors such as: filter response, optimal phase matching, and optimal magnitude matching. The delay circuit 206 can include a cascade of X sub-circuits or X series-connected sub-circuits $2002_1$, $2002_2$, ... $2002_X$. By choosing or selected an appropriate analog filter for the sub-circuits, the delay circuit 206 can achieve a specific filtering response. Each sub-circuit can be implemented in different ways, as exemplified in the FIGURE. In a first example, an analog filter for a given sub-circuit can include a resistor in each differential signal path, as seen in analog filter 2004. In a second example, an analog filter for a given sub-circuit can include an inductor in each differential signal path, as seen in analog filter 2006. In a third example, an analog filter for a given sub-circuit can include a resistor-capacitor lattice, as seen in analog filter 2008. In a fourth example, an analog filter for a given sub-circuit can include an inductor-capacitor lattice, as seen in analog filter 2010. In a fifth example, an analog filter can include grounded capacitors on each differential signal paths, as seen in analog filter 2012. In a sixth example, an analog filter can include a capacitor coupled across the differential signal paths, as seen in analog filter 2014.

Figure 21:
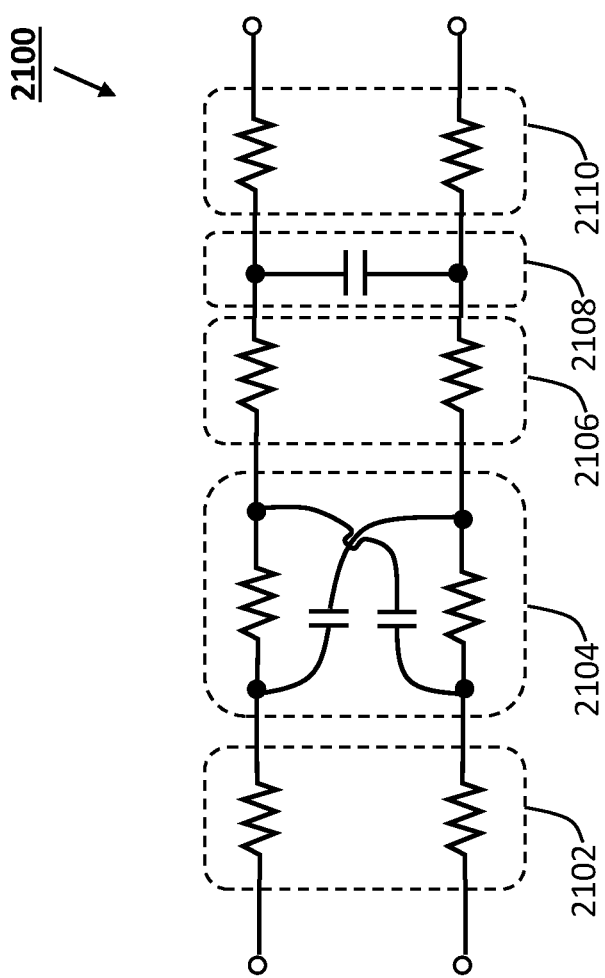
FIG. 21 illustrates one exemplary implementation of a CT delay line, according to some embodiments of the disclosure.

FIG. 21 illustrates one exemplary implementation of a CT delay line 2100, according to some embodiments of the disclosure. The implementation shown in the FIG. 21, includes a cascade of sub-circuits or series-connected sub-circuits 2102, 2104, 2106, 2108, 2110, and 2012. Specifically, sub-circuit 2102, sub-circuit 2106, and sub-circuit 2110, can be implemented using the analog filter 2004 seen in FIG. 20. Sub-circuit 2102 can be implemented using the analog filter 2008 seen in FIG. 20. Sub-circuit 2108 can be implemented using the analog filter 2014 seen in FIG. 20. The selection of analog filters illustrated in FIG. 21 for CT delay line 2100 can provide better phase matching and magnitude matching.

Matching of the delay circuit 206 with the signal path having the quantizer 202 and DAC 204 can mean that the VCO-based CT pipelined ADC can be used in wide bandwidth applications, especially when the delay circuit 206 can achieve the desired response (e.g., group delay) over a wide range of frequencies.

Benefits of Having a CT Residue Generation Front End

The CT residue generation front end 102, specifically, the delay circuit 206 and quantizer 202, has continuous-time circuitry and no samplers. Without samplers, the CT residue generation front end 102 does not suffer from aliasing issues typically associated with ADC front ends that have samplers. A signal chain having the VCO-based CT pipelined ADC 100 can have a much simpler anti-aliasing filter or the anti-aliasing filter can be eliminated altogether. As a result, components of the signal chain can be more easily integrated together in the signal chain, and promotes higher level of integration in the signal chain.

Additionally, the CT residue generation front end 102, specifically, the delay circuit 206 and quantizer 202, has a resistive input structure. The resistive input structure can provide resistive input impedance. Advantageously, the resistive input structure can reduce peak driving current, and also reduce power consumption of the circuits driving the VCO-based CT pipelined ADC.

Residue Amplifier Designs

Referring to FIG. 4, the residue amplifier 208 in the example has a second-order frequency response, which is provided by two cascaded amplifiers and feedback signal paths. More generally, the residue amplifier 208 can be implemented to have a desirable frequency response to provide features such as anti-aliasing. In some embodiments, the residue amplifier 208 can have a low pass filter response. In some embodiments, the residue amplifier 208 can have a bandpass filter response. In some embodiments, the residue amplifier 208 can have a first-order frequency response. In some embodiments, the residue amplifier 208 can have a second-order or higher-order frequency response. In some embodiments, the residue amplifier 208 can have a notch near the sampling frequency fs, which can provide additional anti-aliasing.

DAC Pulse Shaping

One challenge in CT residue generation front end 102 is that the DAC 204 can have strong images in the output spectrum. The strong images can result in a residue signal that has a high amplitude. To address this issue, the residue signal can be minimized by (1) selecting and implementing a specific transfer function in the signal path involving the delay circuit 206, and (2) upsampling the first digital signal $D_1$ and processing the upsampled signal by a discrete-time transfer function.

Figure 11:
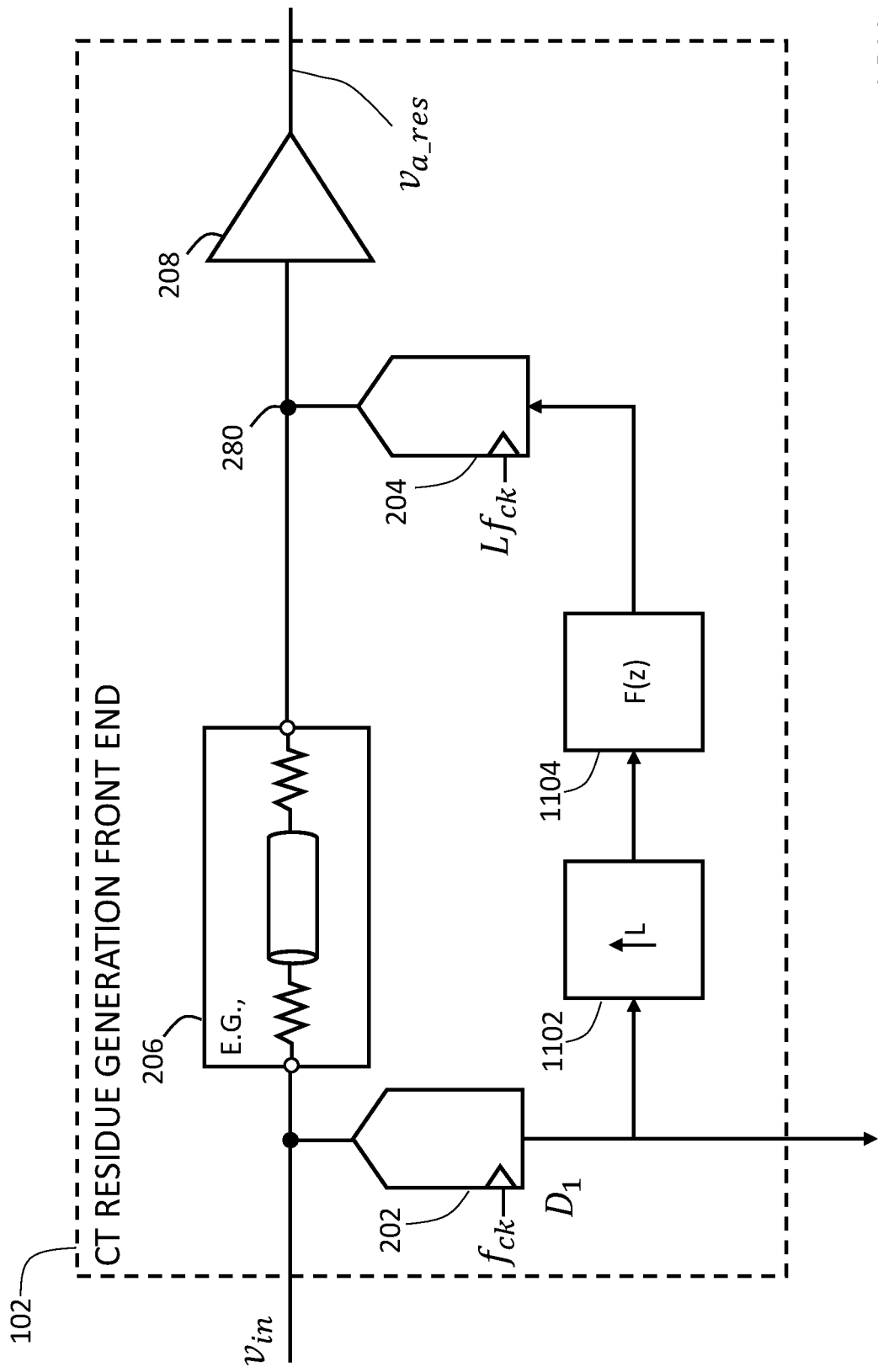
FIG. 11 shows an exemplary implementation of a CT residue generation front end with digital-to-analog converter pulse shaping, according to some embodiments of the disclosure.

FIG. 11 shows an exemplary implementation of a CT residue generation front end 102 with digital-to-analog converter pulse shaping, according to some embodiments of the disclosure. The CT residue generation front end 102 has a signal path with the delay circuit 206. The continuous-time transfer function of the signal path can be C(s). The quantizer 202 generates first digital signal $D_1$ at a rate of $f_{ck}$. The first digital signal $D_1$ is upsampled by an upsampling block 1102 L times. L is the upsampling factor of the upsampling block 1102. Accordingly, the output of the upsampling block 1102 has a rate of $L \cdot f_{ck}$. The upsampling block 1102 can interpolate the first digital signal $D_1$ by inserting (L−1) zeros between every two samples. The output of the upsampling block 1102 is filtered by a digital filter 1104 having a discrete-time transfer function F(z). The output of the digital filter 1104 drives the DAC 204 clocked at a rate of $L \cdot f_{ck}$ (rate of the quantizer 202 multiplied by the upsampling factor of the upsampling block 1102), and is converted into analog form. The DAC 204 generates the reconstructed analog signal based on the output of the digital filter 1104. Node 280 can perform subtraction of the delayed analog input signal from delay circuit 206 and the reconstructed analog input signal from DAC 204 to generate the residue signal. By selecting and implementing C(s) and F(z) appropriately, the residue signal generated at node 280 can be minimized to mostly or entirely the in-band quantization error of the quantizer 202. For a given C(s), F(z) (i.e., the digital filter 1104) can be programmed accordingly to minimize the residue signal. For instance, F(z) can programmed to have a discrete-time transfer function that can to reduce or suppress images in the output spectrum of DAC 204. For a given F(z), C(s) can be implemented (e.g., by implementing the appropriate delay circuit 206) accordingly to minimize the residue signal.

Digital Non-Linear Calibration in the CT VCO ADC Back End

Non-linearities of a VCO ADC 210 can be corrected by a digital non-linearity correction block 106. To correct for the non-linearities, the CT VCO ADC back end 104 extracts the non-linearities, determines coefficients which can correct the non-linearities, and programs the digital non-linearity correction block 106 to correct non-linearities of the VCO ADC 210. The calibration process can operate in the background, and can update the coefficients periodically or from time to time to provide adaptive calibration.

Figure 12:
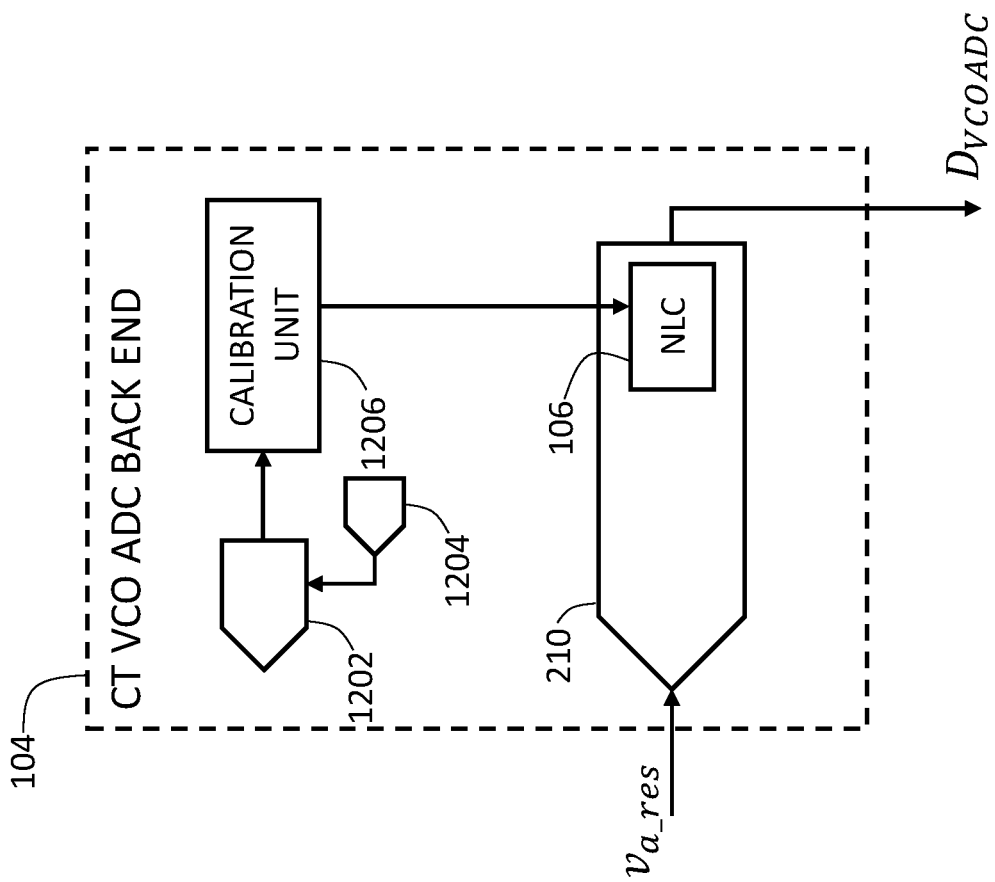
FIG. 12 illustrates non-linear calibration filter and a scheme programming the non-linear calibration filter, according to some embodiments of the disclosure.

FIG. 12 illustrates a digital non-linearity calibration block 106 and a scheme programming the digital non-linearity calibration block 106, according to some embodiments of the disclosure. The CT VCO ADC back end 104 includes a replica VCO ADC 1202 to process a known signal. The replica VCO ADC 1202 comprises a signal path (and circuitry) that is identical to the VCO ADC 210. However, the replica VCO ADC 1202 does not have a digital non-linear calibration block. The replica VCO ADC 1202 receives the known signal generated by a signal generator 1204, and converts the known signal (e.g., a known analog signal) into a digital output. Furthermore, the CT VCO ADC back end 104 includes a calibration unit 1206 to derive coefficients of the digital non-linearity correction block 106 based on the digital output of the replica VCO ADC 1202 and the known signal.

The replica VCO ADC 1202 can receive a differential input voltage of zero (e.g., a constant, midscale input signal), and the signal generator 1204 can be a DAC (receiving a known signal sequence) to inject a known signal into the replica VCO ADC 1202. The known signal can include a calibration sequence that can be used to extract the non-linearities of the VCO ADC 210.

In some embodiments, the calibration sequence can include a sum of independent, zero-mean, pseudo-random sequences. The digital output of the VCO ADC 210 can be correlated with the pseudo-random sequences to extract the non-linearities of the system. In some embodiments, the calibration sequence includes a sum of three pseudo-random sequences: $k_1[n]+k_2[n]+k_3[n]$, and the digital output of the VCO ADC 210 is correlated (separately) with $k_1[n]$, $k_1[n] \cdot k_2[n]$, and $k_1[n] \cdot k_2[n] \cdot k_3[n]$. The result of the correlations yields coefficients that can be used to correct second-order, third-order, and other higher-order non-linearities. The calibration unit 1206 can use the coefficients to compute a corrected digital output values into look-up table of the digital non-linearity calibration block 106, where the look-up table maps possible values of the digital output of VCO ADC 210 to respective corrected digital output values.

In some embodiments, the calibration unit 1206 can determine measure the VCO center frequency so that the VCO center frequency of the VCO ADC 210 can be tuned accordingly.

Pseudo-Differential Signal Paths in the VCO ADC

Calibration using a replica VCO ADC 1202 can be limited, since the calibrations depend on how well the replica VCO ADC 1202 matches the VCO ADC 210. If calibration using a replica VCO ADC 1202 is insufficient to address even-order non-linearities (e.g., second-order non-linearities), it is possible to implement the VCO ADC 210 in a pseudo-differential manner to suppress the even-order non-linearities (at the cost of higher area and power consumption).

Figure 13:
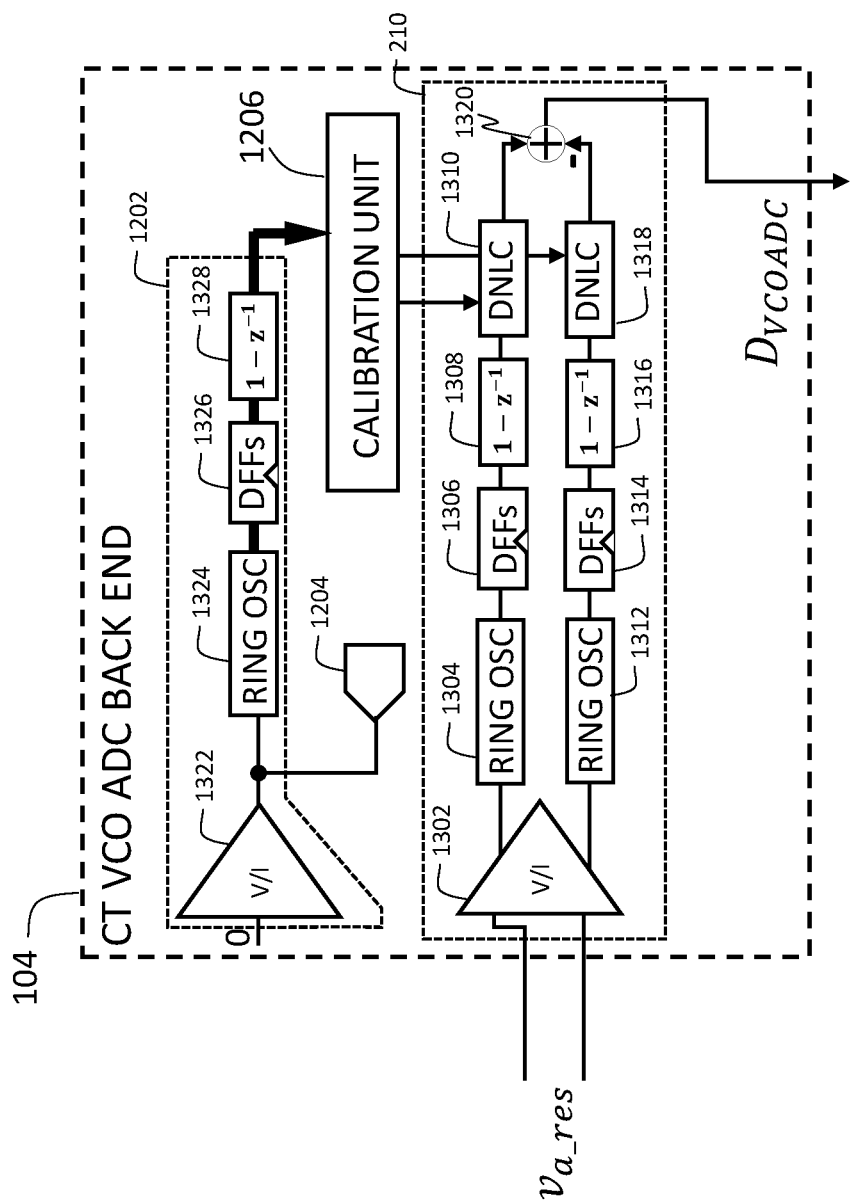
FIG. 13 shows an exemplary implementation of a CT VCO ADC back end having two pseudo-differential signal paths and a replica signal path, according to some embodiments of the disclosure.

FIG. 13 shows an exemplary implementation of a CT VCO ADC back end 104 having two pseudo-differential signal paths and a replica signal path, according to some embodiments of the disclosure. Specifically, the VCO ADC 210 has two pseudo-differential signal paths, and the replica VCO ADC 1202 has a replica signal path.

The two pseudo-differential signal paths share a (same) first voltage-to-current converter 1302, where the first voltage-to-current converter 1302 receives the amplified residue signal $v_{a\_res}$ from the CT residue generation front end 102. The amplified residue signal $v_{a\_res}$ is a differential signal having a positive signal and a negative signal. A first pseudo-differential signal path has a first ring oscillator 1304 to process the positive signal from the first voltage-to-current converter 1302. The first ring oscillator 1304 of the first pseudo-differential signal path is followed by a ring sampler and phase decoder, shown as DFFs 1306. The DFFs 1306 is followed by a differentiator 1308. The differentiator is 1308 is followed by a digital non-linearity calibration block 1310. A second pseudo-differential signal path has a second ring oscillator 1312 to process the negative signal from the first voltage-to-current converter 1302. The second ring oscillator 1312 of the second pseudo-differential signal path is followed by a ring sampler and phase decoder, shown as DFFs 1314. The DFFs 1314 is followed by a differentiator 1316. The differentiator is 1316 is followed by a digital non-linearity calibration block 1318. The outputs of the first pseudo-differential signal path and the second pseudo-differential signal path (e.g., outputs of the digital non-linearity calibration block 1310 and digital non-linearity calibration block 1318) are combined at a first node 1320. Specifically, the output of the first pseudo-differential signal path is subtracted by the output of the second pseudo-differential signal path to form a final output of the VCO ADC 210. The subtraction or differencing can suppress even-order non-linearities, because components that are common to both pseudo-differential signal paths would be cancelled out.

The replica VCO ADC 1202 with the replica signal path has the same/identical circuitry as the pseudo-differential signal paths (except for the replica signal path does not have a digital non-linearity calibration block). The replica VCO ADC 1202 has a voltage-to-current converter 1322 receiving a differentially zero input. The signal generator 1204 can inject a (current) signal to the output of the voltage-to-current converter 1322. The replica signal path includes a ring oscillator 1324, DFFs 1326, and differentiator 1328. The output of the differentiator 1328 is provided to calibration unit 1206 to perform calibration operations as described in relation to FIG. 12.

Quantization noise can significantly degrade the performance of the CT VCO ADC back end 104. The degradation in performance, in the form of spurious tones correlated with the input signal, is particularly serious for low amplitude signals. Dithering the input signal with a sequence that is white and uniformly distributed over a range of frequencies that is uncorrelated with the input signal can spread the tones into the noise floor and ameliorate the input signal dependent distortions. However, injection of a dither to a VCO ADC can degrade signal-band SNR because the dither is not subject to the noise transfer function of a VCO ADC. To address the degradation in signal-band SNR, a self-cancelling dither scheme is used. A dither is added to the input of one pair of pseudo-differential signal paths, and the same dither is subtracted from the input of another pair of pseudo-differential signal paths. The outputs of the pairs of pseudo-differential signal paths are summed. The undesirable components that are introduced by the dither have equal magnitudes and opposite polarities. When the outputs of the pairs of pseudo-differential signal paths are summed, the undesirable components introduced by the dither are cancelled, the signal components add in amplitude, and the noise components add in power.

Accordingly, the SNR is improved significantly through the self-dithering scheme.

Figure 14:
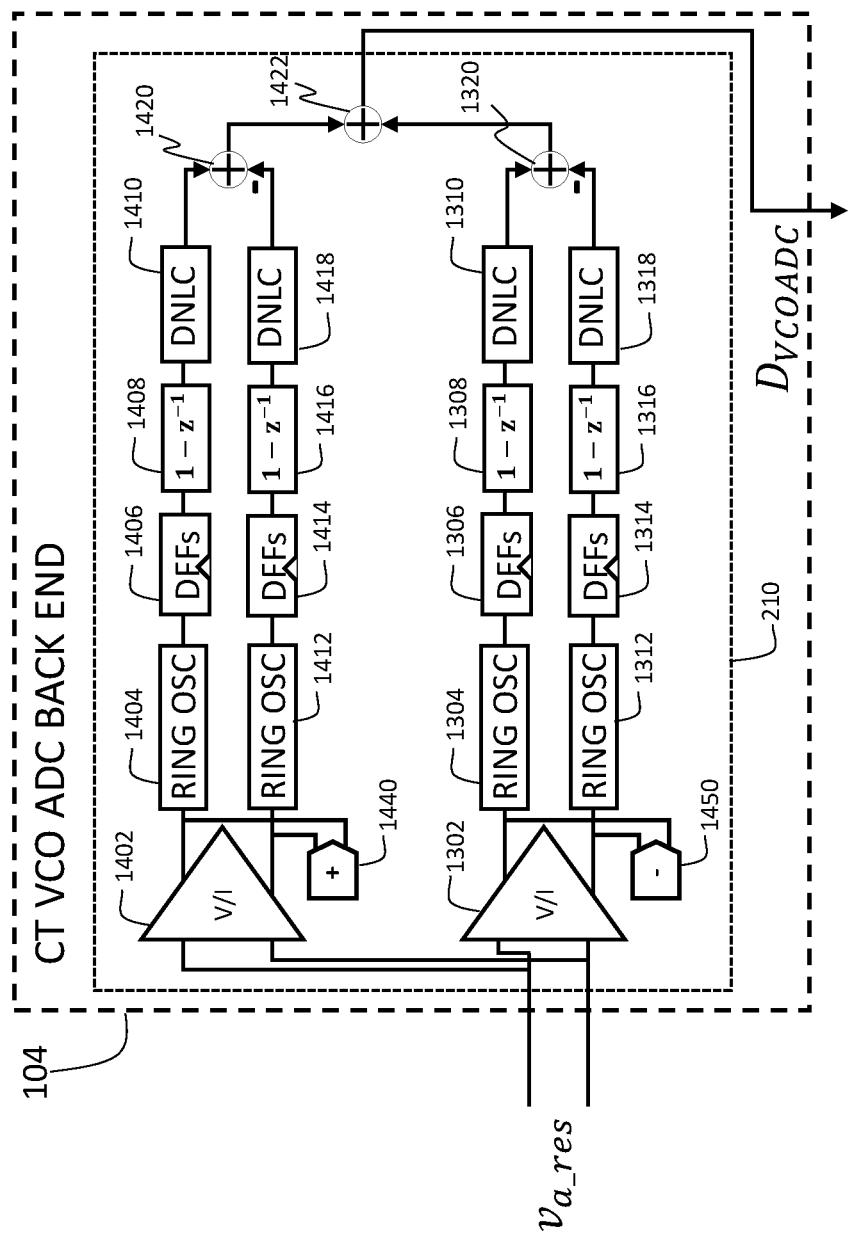
FIG. 14 shows an exemplary implementation of a CT VCO ADC back end having two pairs of pseudo-differential signal paths, according to some embodiments of the disclosure.

FIG. 14 shows an exemplary implementation of a CT VCO ADC back end 104 having two pairs of pseudo-differential signal paths, according to some embodiments of the disclosure. A first pair of pseudo-differential signal paths follow the first voltage-to-current converter 1302. The first and second pseudo-differential signal paths process a positive signal from the voltage-to-current converter 1302 and a negative signal from the voltage-to-current converter 1302, respectively. The outputs from the first and second pseudo-differential signal paths are differenced at node 1320. A second pair of pseudo-differential signal paths follow a second voltage-to-current converter 1402. The second voltage-to-current converter 1402 receives the amplified residue signal $v_{a\_res}$ from the CT residue generation front end 102. A third pseudo-differential signal path has a third ring oscillator 1404 to process the positive signal from the second voltage-to-current converter 1402. The third ring oscillator 1404 of the third pseudo-differential signal path is followed by a ring sampler and phase decoder, shown as DFFs 1406.

The DFFs 1406 is followed by a differentiator 1408. The differentiator is 1408 is followed by a digital non-linearity calibration block 1410. The fourth pseudo-differential signal path has a fourth ring oscillator 1412 to process the negative signal from the second voltage-to-current converter 1402. The fourth ring oscillator 1412 of the fourth pseudo-differential signal path is followed by a ring sampler and phase decoder, shown as DFFs 1414. The DFFs 1414 is followed by a differentiator 1416. The differentiator is 1416 is followed by a digital non-linearity calibration block 1418. The outputs of the third pseudo-differential signal path and the fourth pseudo-differential signal path (e.g., outputs of the digital non-linearity calibration block 1410 and digital non-linearity calibration block 1418) are combined at a second node 1420. Specifically, the output of the third pseudo-differential signal path is subtracted by the output of the fourth pseudo-differential signal path. The subtraction or differencing can suppress even-order non-linearities, because components that are common to both pseudo-differential signal paths would be cancelled out.

The outputs of the first node 1320 and the output of the second node 1420 are combined by a third node 1422. Specifically, the outputs of the first pair of pseudo-differential signal paths and the second pair of pseudo-differential signal paths are summed at the third node 1422. To inject self-cancelling dither, the VCO ADC 210 further includes first circuitry 1440 to inject dither having a first polarity to the first pseudo-differential signal path and the second pseudo-differential signal path, and second circuitry 1450 to inject dither having a second polarity opposite to the first polarity to the third pseudo-differential signal path and the fourth pseudo-differential signal path. The first circuitry 1440 can be a signal generator (e.g., a DAC receiving a dither sequence and outputting the dither having the first polarity) to add a dither to the inputs of the first pair of pseudo-differential signal paths. The second circuitry 1450 can be a signal generator (e.g., a DAC receiving a same dither sequence but outputting the dither having the second polarity) to remove the same dither at the inputs of the second pair of pseudo-differential signal paths.

Phase Interpolation in the VCO ADC to Increase Bandwidth

Figure 15:
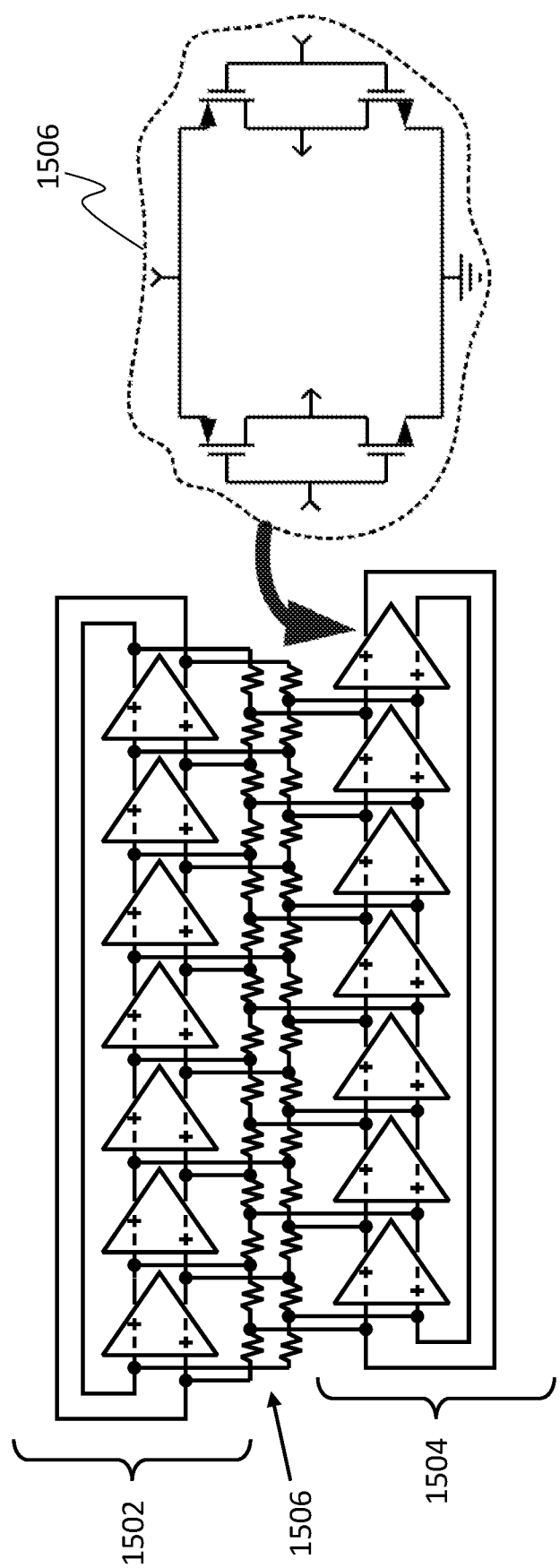
FIG. 15 shows an exemplary phase interpolated ring oscillator, according to some embodiments of the disclosure.

A SQNR over a signal bandwidth of a VCO ADC increases with a number of quantization levels and an oversampling ratio. A VCO ADC's number of quantization levels is determined by a minimum delay through each one of the delay elements. To decrease the minimum delay and improve SQNR, the ring oscillator can be modified to include two interpolated ring oscillators, e.g., two ring oscillators injection locked together, or two phase shifted ring oscillators. FIG. 15 shows an exemplary phase interpolated ring oscillator, according to some embodiments of the disclosure. A ring oscillator in a VCO ADC signal path can include a first injection locked ring oscillator 1502 and a second injection locked ring oscillator 1504. In the example shown, the first injection locked ring oscillator 1502 has 7 delay elements, and the second injection locked ring oscillator 1504 has 7 delay elements. The first injection locked ring oscillator 1502 and the second injection locked ring oscillator 1504 are quadrature-coupled together via a resistor network 1506 to lock the first injection locked ring oscillator 1502 and the second injection locked ring oscillator 1504 90° out of phase with each other. The result is a phase interpolated ring oscillator having 14 delay elements, with half the minimum delay. Accordingly, the SQNR and bandwidth is significantly improved. Having a high bandwidth, phase interpolated, CT VCO ADC back end 104 can benefit the overall wide bandwidth response of the VCO-based pipelined ADC.

Figure 16:
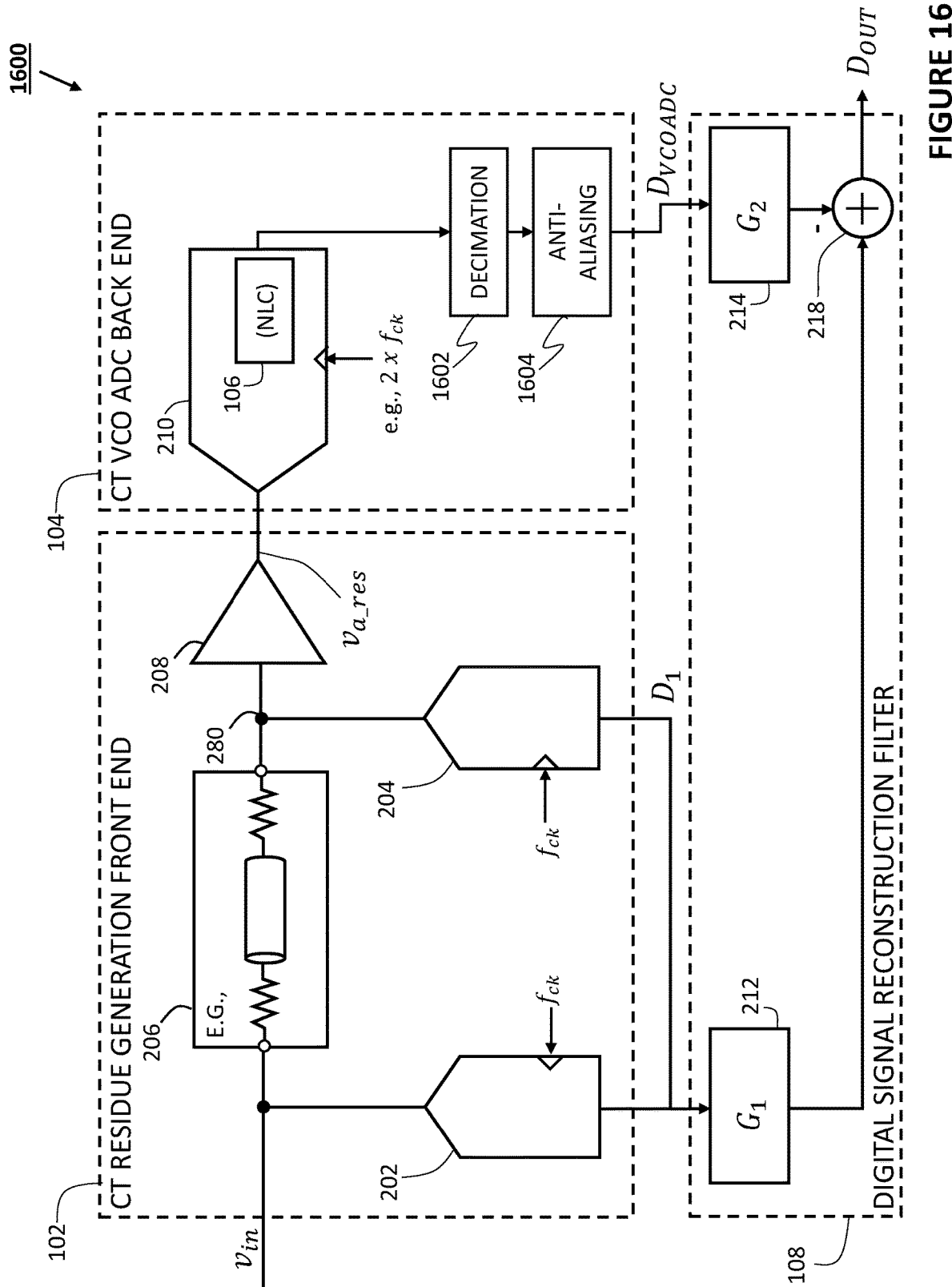
FIG. 16 shows an exemplary implementation of a VCO-based CT pipelined ADC having a CT residue generation front end and an oversampling CT VCO ADC back end, according to some embodiments of the disclosure.

Locking the VCO ADC to a Different, Higher Sampling Rate than the Sampling Rate of the CT Residue Generation Front End The architecture of the VCO-based CT pipelined ADC allows for the CT residue generation front end 102 and the VCO ADC back end 104 to have different sampling rates. Oversampling ratio and sampling rate of a VCO ADC can affect the SQNR of a VCO ADC. To further improve SQNR, the CT VCO ADC back end 104 can be clocked by a doubled or higher (e.g., 2×, 4×, 6×, 8×, etc.) clock frequency or tuned/locked to doubled or higher (e.g., 2×, 4×, 6×, 8×, etc.) clock frequency with respect to the clock frequency driving the CT residue generation front end 102. FIG. 16 shows an exemplary implementation of a VCO-based CT pipelined ADC 1600 having a CT residue generation front end 102 and an oversampling VCO ADC back end 104, according to some embodiments of the disclosure. The CT residue generation front end 102 is driven by a first clock signal having a first clock frequency $f_{ck}$. For instance, the quantizer 202 is driven by $f_{ck}$. The DAC 204 can be driven by $f_{ck}$, or a suitable multiple of $f_{ck}$ if DAC pulse shaping (as illustrated in FIG. 11) is implemented. The CT VCO ADC back end 104 is driven by a second clock signal having a second clock frequency $K \cdot f_{ck}$ that is K times the first clock frequency, where K is at least two, or an integer multiple of 2. When the CT VCO ADC back end 104 is driven by the higher, second clock frequency, the CT VCO ADC back end 104 includes a decimation filter 1602 to reduce the sample rate to match the sample rate of the CT residue generation front end 102, and an anti-aliasing filter (e.g., a low pass filter) to remove unwanted images in the output spectrum. Tuning/locking to a doubled or higher (e.g., 2×, 4×, 6×, 8×, etc.) clock frequency can improve linearity of the CT VCO ADC back end 104. Additionally, an integer multiple of the clock frequency maximizes the range of phase detection of the CT VCO ADC back end 104.

Higher-Order CT VCO ADC Back End

Figure 17:
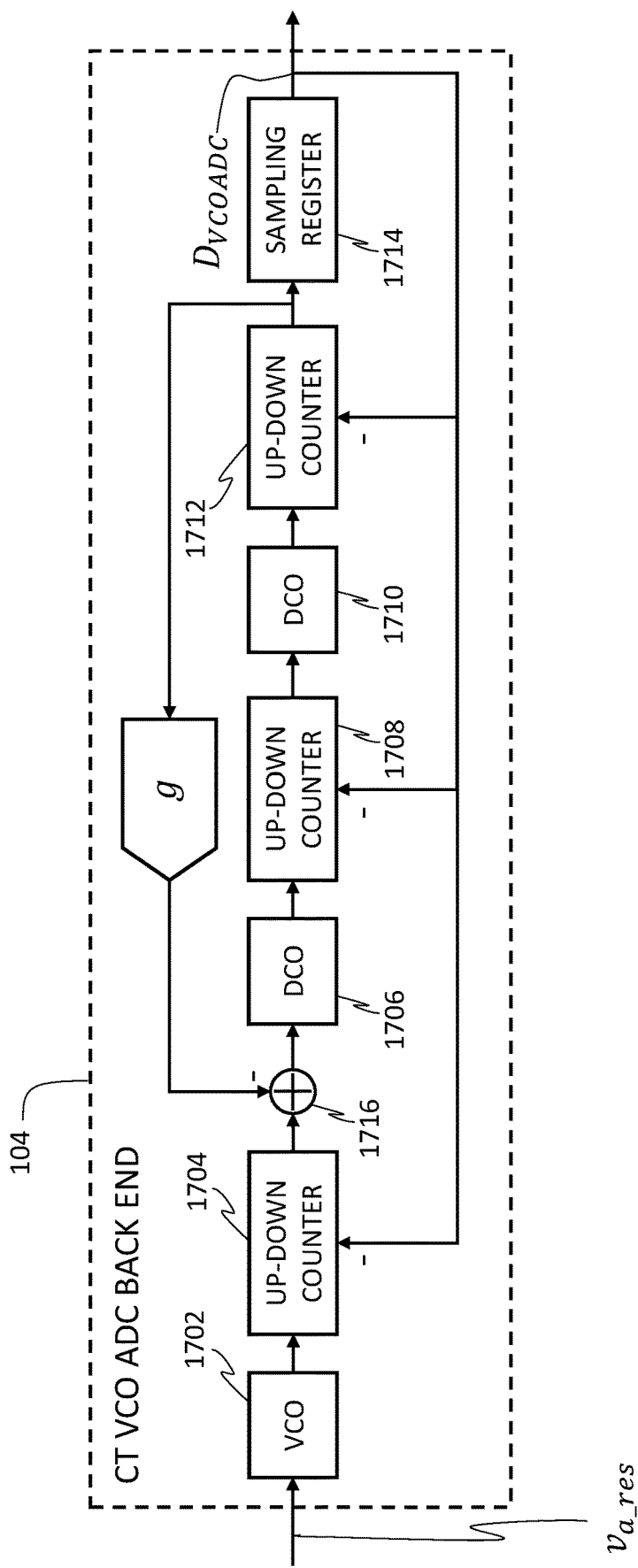
FIG. 17 shows an exemplary implementation of a higher-order CT VCO ADC back end, according to some embodiments of the disclosure.

In some embodiments, the CT VCO ADC back end 104 can be modified to implement a higher-order structure to extend noise shaping benefits of the CT VCO ADC back end 104. FIG. 17 shows an exemplary implementation of a higher-order CT VCO ADC back end 104, according to some embodiments of the disclosure. Specifically, the CT VCO ADC implements third-order noise shaping. The CT VCO ADC back end 104 comprises multiple oscillators (in this example, three oscillators) and one or more feedback path(s) to implement multi-order noise shaping. In the example shown, the CT VCO ADC back end 104 includes a first VCO 1702, an up-down counter 1704, a digitally-controlled-oscillator (DCO) 1706, an up-down counter 1708, a DCO 1710, and sampling register 1714. The second digital output $D_{VCOADC}$ generated by the sampling register 1714 is provided to up-down counter 1704, up-down counter 1708, and up-down counter 1712 as feedback. Additionally, the second digital output $D_{VCOADC}$ generated by the sampling register 1714 is provided to node 1716 as feedback with a gain of g. The overall feedback of the second digital output $D_{VCOADC}$ to selected locations, as illustrated by the FIGURE, implements higher-order noise shaping.

Modularity and Re-Configurability of the VCO-Based CT Pipelined ADC

The VCO-based CT pipelined ADC can be implemented with no feedback. This is in contrast to delta-sigma ADCs or successive-approximation-register ADCs which has feedback paths. In other words, the CT residue generation front end 102 and the CT VCO ADC back end 104 only has feedforward paths. There is no overall feedback from the output of the CT VCO ADC back end 104 back to the input of the CT residue generation front end 102. This architecture has several benefits. Not having feedback means that it is more practical and easier to include signal processing that has a signal latency. The signal processing includes digital signal processing of digital signals of the CT residue generation front end 102 and the CT VCO ADC back end 104. The signal processing, often used with VCO ADCs, can include digital non-linearity correction, and over-range correction. Moreover, feedback paths can dramatically change the stability and transfer function of an ADC. In some cases, feedback paths can limit the bandwidth of the ADC. Also, having no feedback paths guarantees the stability of the VCO-based CT pipelined ADC.

Figure 18:
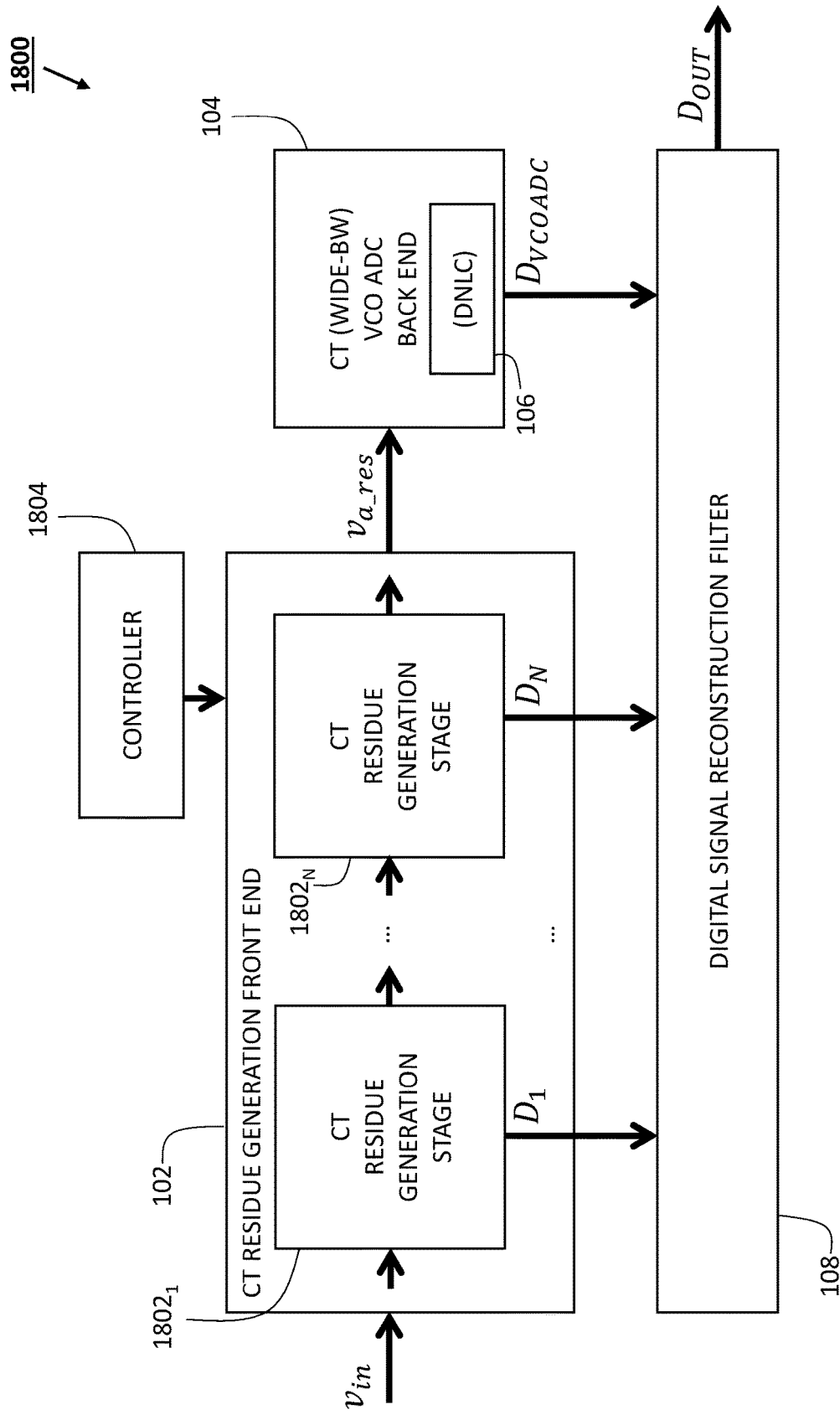
FIG. 18 shows an exemplary implementation of a VCO-based CT pipelined ADC having a re-configurable CT residue generation front end and a CT VCO ADC back end, according to some embodiments of the disclosure.

Not having feedback also means that the VCO-based CT pipelined ADC is modular. An ADC architecture with feedback paths cannot be modified easily without significant redesign of the ADC. The modularity also allows for re-configurability of the VCO-based CT pipelined ADC. FIG. 18 shows an exemplary implementation of a VCO-based CT pipelined ADC 1800 having a re-configurable CT residue generation front end 102 and a CT VCO ADC back end 104, according to some embodiments of the disclosure. The CT residue generation front end 102 is cascaded and followed by the CT VCO ADC back end 104. The CT residue generation front end 102 generates an amplified residue signal $v_{a\_res}$. The CT residue generation front end 102 can include N cascaded CT residue generation stages $1801_1, \ldots 1802_N$. The CT residue generation front end 102 quantizes an analog input signal $v_{in}$ and generates digital signals $D_1, \ldots D_N$ and the amplified residue signal $v_{a\_res}$. Each CT residue generation stage can include a quantizer, a DAC, a delay circuit, node, and a residue amplifier. The respective quantizers in the CT residue generation stage generates respective digital signals $D_1, \ldots D_N$. The respective residue amplifiers in the CT residue generation stage generates respective amplified residue signals. The CT VCO ADC back end 104 quantizes the amplified residue signal $v_{a\_res}$ and generates digital signal $D_{VCOADC}$. The digital signal reconstruction filter 108 filters digital signals $D_1, \ldots D_N$ from the residue generating stages and the second digital signal $D_{VCOADC}$, and generates a final digital signal $D_{OUT}$. The digital signal reconstruction filter 108 can be programmed in a manner as previously described with FIG. 3 (with some differences).

Since there are no feedback paths within or between the cascaded CT residue generation stages $1801_1, \ldots 1802_N$, and there is no overall feedback from the CT VCO ADC back end 104 to the CT residue generation front end 102, the number of cascaded CT residue generation stages and the parameters for each cascaded CT residue generation stage can be modified easily. For instance, a circuit designer can change the number of cascaded CT residue generation stages and the parameters for each cascaded CT residue generation stage based on target performance metrics such as: power consumption, noise, distortion, silicon area, and digital signal processing complexity. In other words, stages can be added or removed easily to achieve certain target performance metrics. Increasing the number of cascaded CT residue generation stages can provide better anti-aliasing, better SNR, better NSD by impedance scaling.

Additionally, modularity allows for re-configurability on-chip. This means that an integrated circuit can include N residue generation stages in the CT residue generation front end 102, and switches or a switching network (e.g., transistors) can be provided to the inputs and/or outputs of the N residue generation stages to configure or re-configure the signal chain in the CT residue generation front end 102 and change the number of residue generation stages $1801_1, \ldots 1802_N$ being used, in cascade, to quantize the analog input signal $v_{in}$ and to generate the amplified residue signal $v_{a\_res}$. Configurable/controllable/programmable routing that is internal and/or external to silicon die or integrated circuit package in which the VCO-based CT pipelined ADC 1800 can be used to configure or re-configure the number of residue generation stages $1801_1, \ldots 1802_N$ being used to quantize the analog input signal $v_{in}$ and to generate the amplified residue signal $v_{a\_res}$. Controller 1804 can control such circuitry that can control the number of residue generation stages being used, and thus re-configure the architecture of the VCO-based CT pipelined ADC 1800. In some embodiments, the controller 1804 can re-configure connections for the residue generation stages to change a number of cascaded CT residue generation stages $1801_1, \ldots 1802_N$ being used to generate the amplified residue signal $v_{a\_res}$.

Methods for Pipelined Analog-to-Digital Conversion

Figure 19:
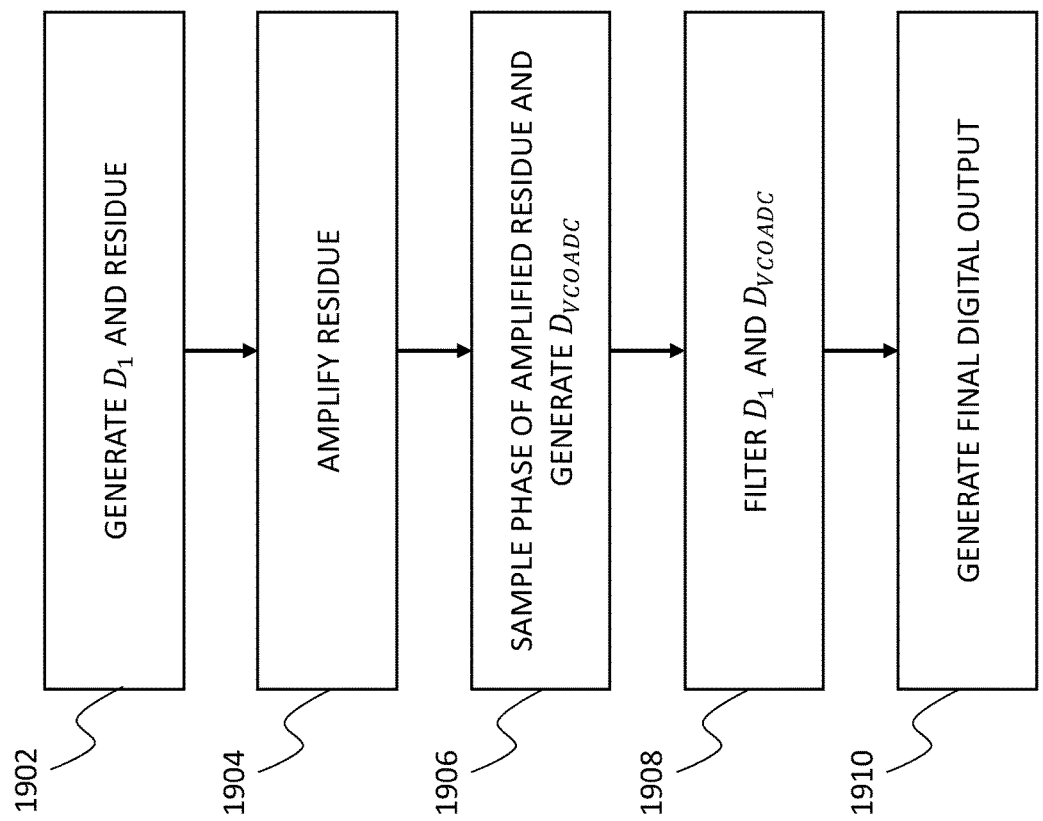
FIG. 19 is a flow diagram illustrating a method for pipelined analog-to-digital conversion, according to some embodiments of the disclosure.

FIG. 19 is a flow diagram illustrating a method for pipelined analog-to-digital conversion, according to some embodiments of the disclosure. In 1902, a CT front end (e.g., a CT residue generation front end 102) generates a first digital signal (e.g., $D_1$) representing an analog input signal (e.g., $v_{in}$), and a residue signal representing a difference between a delayed version of the analog input signal and a reconstructed analog signal generated from the first digital signal. In 1904, a residue amplifier amplifies the residue signal to generate an amplified residue signal (e.g., $v_{a\_res}$). In 1906, a VCO ADC back end (e.g., CT VCO ADC back end 104) samples phase of the $v$ amplified residue signal, and generates a second digital signal (e.g., $D_{VCOADC}$) based on the phase of the amplified residue signal. In 1908, a digital signal reconstruction filter (e.g., a digital signal reconstruction filter 108) filters the first digital signal and the second digital signal. In 1910, the digital signal reconstruction filter combines filtered versions of the first digital signal and the second digital signal to generate a final digital output.

In some embodiments, the method further includes delaying, by a delay circuit (e.g., delay circuit 206), the analog input signal. The response of the delay circuit matches a response of a signal path having a quantizer and a digital-to-analog-converter. Examples of such embodiments are illustrated in FIGS. 2, 4-10, and 20-21.

In some embodiments, the method further includes injecting a dither (e.g., LFSR of FIG. 3) at an input of a residue amplifier amplifying the residue signal. The method can further include extracting, based on the dither and the second digital signal, a signal transfer function of the residue amplifier, and a signal transfer function of the VCO ADC back end. The method can further include programming a first filter to filter the first digital signal and/or a second filter to filter the second digital signal based on a signal transfer function of a residue amplifier amplifying the residue signal, and a signal transfer function of the VCO ADC back end. An example of such embodiments is illustrated in FIG. 3.

In some embodiments, the method further comprises driving the CT front end with a first clock signal having a first clock frequency, and driving the VCO ADC back end with a second clock signal having a second clock frequency that is at least two times the first clock frequency. The method can further include decimating a digital output of the VCO ADC back end, and filtering a decimated version of the digital output of the VCO ADC back end by an anti-aliasing filter to generate the second digital signal. An example of such embodiments is illustrated in FIG. 16.

In some embodiments, the method further comprises adjusting a number of residue generation stages being used in the continuous-time front end to generate the amplified residue signal. An example of such embodiments is illustrated in FIG. 18.

EXAMPLES

Example 1 is a pipelined analog-to-digital converter (ADC), comprising: a continuous-time residue generation front end to quantize an analog input signal and generate a first digital signal and an amplified residue signal; a voltage-controlled-oscillator (VCO) ADC back end to quantize the amplified residue signal and generate a second digital signal; and a digital signal reconstruction filter to filter the first digital signal and the second digital signal and to generate a final digital signal.

In Example 2, the pipelined ADC of Example 1 can optionally include the continuous-time residue generation front end comprising: a quantizer to generate the first digital signal; a digital-to-analog converter to receive the first digital signal and generate a first reconstructed analog signal; and a delay circuit to delay a first analog input signal to the quantizer and generate a first delayed analog input signal, wherein a response of the delay circuit matches a response of a signal path having the quantizer and the digital-to-analog-converter.

In Example 3, the pipelined ADC of Example 2 can optionally include the delay circuit matching magnitude and phase of the signal path.

In Example 4, the pipelined ADC of any one of Examples 1-3 can optionally include the delay circuit comprising a resistor-capacitor lattice.

In Example 5, the pipelined ADC of any one of Examples 1-4 can optionally include the delay circuit comprising one or more inductor-capacitor lattices.

In Example 6, the pipelined ADC of any one of Examples 2-5 can optionally include the continuous-time residue generation front end further comprising: a node to output a first residue signal representing a difference between the first delayed analog input signal and the first reconstructed analog signal.

In Example 7, the pipelined ADC of any one of Examples 1-6 can optionally include the continuous-time residue generation front end comprising: a residue amplifier to amplify a residue signal and to generate the amplified residue signal.

In Example 8, the pipelined ADC of Example 7 can optionally include the residue amplifier comprising has a second or higher-order frequency response.

In Example 9, the pipelined ADC of any one of Examples 1-8 can optionally include the digital signal reconstruction filter comprising: a first filter to filter the first digital signal; a second filter to filter the second digital signal; and a node to combine outputs of the first filter and the second filter to generate the final digital signal.

In Example 10, the pipelined ADC of Example 9 can optionally include a ratio of the first filter and the second filter corresponding to (1) a signal transfer function of a residue amplifier generating the amplified residue signal, and (2) a signal transfer function of the VCO ADC back end.

In Example 11, the pipelined ADC of Example 9 or 10 can optionally include a ratio of the first filter and the second filter corresponding to (1) a signal transfer function of a residue amplifier generating the amplified residue signal, (2) a signal transfer function of the VCO ADC back end, (3) a noise transfer function of the CT residue generation front end.

In Example 12, the pipelined ADC of any one of Examples 1-11 can optionally include the continuous-time residue generation front end comprising: a residue amplifier to amplify a residue signal and to generate the amplified residue signal; and circuitry to inject a dither at an input of the residue amplifier; and the pipelined ADC further comprising: a correlator to cross-correlate the dither and the second digital signal to extract (1) a signal transfer function of a residue amplifier generating the amplified residue signal, and (2) a signal transfer function of the VCO ADC back end.

In Example 13, the pipelined ADC of any one of Examples 1-12 can optionally include the continuous-time residue generation front end comprising: a quantizer to generate the first digital signal; an upsampling block to upsample the first digital signal; a filter to filter an output of the upsampling block; and a digital-to-analog converter to receive an output of the filter and generate a first reconstructed analog signal.

In Example 14, the pipelined ADC of Example 13 can optionally include: the quantizer operates at a first rate; the digital-to-analog converter operates at a second rate; and the second rate is the first rate multiplied an upsampling factor of the upsampling block.

In Example 15, the pipelined ADC of any one of Examples 1-14 can optionally include the VCO ADC back end comprising: a digital non-linearity correction block to correct non-linearities of the VCO ADC back end.

In Example 16, the pipelined ADC of Example 15, can optionally include the VCO ADC back end comprising: a replica VCO ADC to process a known signal; and a calibration unit to derive coefficients of the digital non-linearity correction filter based on a digital output of the replica VCO ADC and the known signal.

In Example 17, the pipelined ADC of any one of Examples 1-16 can optionally include the VCO ADC back end comprising: (1) a first voltage-to-current converter to receive the amplified residue signal; (2) a first signal path having a first ring oscillator to process a positive signal from the first voltage-to-current converter; (3) a second signal path having a second ring oscillator to process a negative signal from the first voltage-to-current converter; and (4) a first node to combine outputs of the first signal path and the second signal path.

In Example 18, the pipelined ADC of Example 17 can optionally include the VCO ADC back end further comprising: (5) a second voltage-to-current converter to receive the amplified residue signal; (6) a third signal path having a third ring oscillator to process the positive signal from the second voltage-to-current converter; (7) a fourth signal path having a fourth ring oscillator to process the negative signal from the second voltage-to-current converter; and (8) a second node to combine outputs of the third signal path and the fourth signal path; and (9) a third node to combine outputs of the first node and the second node.

In Example 19, the pipelined ADC of Example 18 can optionally include the VCO ADC back end further comprising: (10) first circuitry to inject dither having a first polarity to the first signal path and the second signal path, and (11) second circuitry to inject dither having a second polarity opposite to the first polarity to the third signal path and the fourth signal path.

In Example 20, the pipelined ADC of any one of Examples 1-19 can optionally include the VCO ADC back end comprising two injection locked ring oscillators.

In Example 21, the pipelined ADC of any one of Examples 1-20 can optionally include the continuous-time residue generation front end is driven by a first clock signal having a first clock frequency; and the VCO ADC back end is driven by a second clock signal having a second clock frequency that is at least two times the first clock frequency.

In Example 22, the pipelined ADC of any one of Examples 1-21 can optionally include the VCO ADC comprising a decimation filter and an anti-aliasing filter.

In Example 23, the pipelined ADC of any one of Examples 1-22 can optionally include the VCO ADC back end comprising multiple oscillators and one or more feedback path(s) to implement multi-order noise shaping.

In Example 24, the pipelined ADC of any one of Examples 1-23 can optionally include the continuous-time residue generation front end comprising cascaded continuous-time residue generation stages.

In Example 25, the pipelined ADC of any one of Examples 1-24 can optionally include a number of residue generation stages being used to quantize the analog input signal and to generate the amplified residue signal is configurable by a controller.

In Example 26, the pipelined ADC of any one of Examples 1-25 can optionally include the VCO ADC back end comprises the following in series: a ring oscillator, a phase-to-digital converter, and a differentiator.

Example 27, a method for pipelined analog-to-digital conversion, comprising: generating, by continuous-time front end, a first digital signal representing an analog input signal, and a residue signal representing a difference between a delayed version of the analog input signal and a reconstructed analog signal generated from the first digital signal; amplifying the residue signal to generate an amplified residue signal; sampling, by voltage-controlled-oscillator (VCO) analog-to-digital converter (ADC) back end, phase of the amplified residue signal; generating, by the VCO ADC back end, a second digital signal based on the phase of the amplified residue signal; filtering the first digital signal and the second digital signal; and combining filtered versions of the first digital signal and the second digital signal to generate a final digital output.

In Example 28, the method of Example 27 can optionally include delaying, by a delay circuit, the analog input signal, wherein a response of the delay circuit matches a response of a signal path having a quantizer and a digital-to-analog-converter.

In Example 29, the method of Example 27 or 28 can optionally include injecting a dither at an input of a residue amplifier amplifying the residue signal.

In Example 30, the method of Example 29 can optionally include extracting, based on the dither and the second digital signal a signal transfer function of the residue amplifier, and a signal transfer function of the VCO ADC back end.

In Example 31, the method of any one of Examples 27-30 can optionally include: programming a first filter to filter the first digital signal and/or a second filter to filter the second digital signal based on a signal transfer function of a residue amplifier amplifying the residue signal, and a signal transfer function of the VCO ADC back end.

In Example 32, the method of any one of Examples 27-31 can optionally include: driving the continuous-time front end with a first clock signal having a first clock frequency; and driving the VCO ADC back end with a second clock signal having a second clock frequency that is at least two times the first clock frequency.

In Example 33, the method of Example 32 can optionally include: decimating a digital output of the VCO ADC back end; and filtering a decimated version of the digital output of the VCO ADC back end by an anti-aliasing filter to generate the second digital signal.

In Example 34, the method of any one of Examples 27-33 can optionally include: adjusting a number of residue generation stages being used in the continuous-time front end to generate the amplified residue signal.

Example 35 is a modular pipelined ADC, comprising: a continuous-time residue generation front end to generate an amplified residue signal, wherein the continuous-time residue generation front end comprises a plurality of residue generating stages in cascade; a voltage-controlled-oscillator (VCO) ADC back end to quantize the amplified residue signal and generate a second digital signal; and a digital signal reconstruction filter to filter digital signals from the residue generating stages and the second digital signal, and to generate a final digital signal.

In Example 36, the modular pipelined ADC of Example 35 can optionally include the continuous-time residue generation front end is to quantize an analog input signal and generate a plurality of digital signals and the amplified residue signal.

In Example 37, the modular pipelined ADC of Example 35 or 36 can optionally include a controller to re-configure connections for the residue generation stages to change a number of residue generation stages being used to generate the amplified residue signal.

Example A is an apparatus comprising means for implementing and/or carrying out the methods of any one of Examples 27-34 and/or any of the functionalities described herein.

OTHER IMPLEMENTATION NOTES, VARIATIONS, AND APPLICATIONS

The present architecture for a VCO-based CT pipelined ADC are particularly suitable for high speed, high precision applications. Applications which can greatly benefit from the architecture include: instrumentation, testing, spectral analyzers, military purposes, radar, wired or wireless communications, mobile telephones (especially because standards continue to push for higher speed communications), and base stations.

In some embodiments, VCO-based CT pipelined ADC can be implemented with an on-chip microprocessor (i.e., on-chip with the ADC, executing instructions/firmware provided to the on-chip microprocessor) and/or dedicated on-chip digital hardware, to carry out digital signal processing functions. In various other embodiments, the digital filters or digital functionalities may be implemented in one or more silicon cores in Application Specific Integrated Circuits (ASICs), Field Programmable Gate Arrays (FPGAs), and other semiconductor architectures.

All of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the present disclosure, appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

The functions related to pipelined analog-to-digital conversion, such as the processes illustrated by FIG. 19, illustrate only some of the possible functions that may be executed by, or within, the circuits illustrated in the FIGURES or circuits coupled to the systems illustrated in the FIGURES (e.g., digital circuitry or an on-chip microprocessor). Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the disclosure, appended claims. Note that all optional features of the apparatus described above may also be implemented with respect to the method or process described herein and specifics in the examples may be used anywhere in one or more embodiments.

What is claimed is:

1. A pipelined analog-to-digital converter (ADC), comprising:
   a continuous-time residue generation front end to quantize an analog input signal, and to generate a first digital signal and an amplified residue signal;
   a voltage-controlled-oscillator (VCO) ADC back end to quantize the amplified residue signal, and to generate a second digital signal; and
   a digital signal reconstruction filter to filter the first digital signal and the second digital signal, and to generate a final digital signal.

2. The pipelined ADC of claim 1, wherein the continuous-time residue generation front end comprises:
   a quantizer to generate the first digital signal;
   a digital-to-analog converter to receive the first digital signal, and to generate a first reconstructed analog signal; and
   a delay circuit to delay a first analog input signal to the quantizer, and to generate a first delayed analog input signal, wherein a response of the delay circuit matches a response of a signal path having the quantizer and the digital-to-analog converter.

3. The pipelined ADC of claim 2, wherein the delay circuit matches magnitude and phase of the signal path.

4. The pipelined ADC of claim 2, wherein the delay circuit comprises a resistor-capacitor lattice.

5. The pipelined ADC of claim 2, wherein the delay circuit comprises one or more inductor-capacitor lattices.

6. The pipelined ADC of claim 2, wherein the continuous-time residue generation front end further comprises:
   a node to output a first residue signal representing a difference between the first delayed analog input signal and the first reconstructed analog signal.

7. The pipelined ADC of claim 1, wherein the continuous-time residue generation front end comprises:
   a residue amplifier to amplify a residue signal, and to generate the amplified residue signal.

8. The pipelined ADC of claim 7, wherein the residue amplifier has a second or higher-order frequency response.

9. The pipelined ADC of claim 1, wherein the digital signal reconstruction filter comprises:
   a first filter to filter the first digital signal;
   a second filter to filter the second digital signal; and
   a node to combine outputs of the first filter and the second filter, and to generate the final digital signal.

10. The pipelined ADC of claim 9, wherein:
    a ratio of the first filter and the second filter corresponds to: (1) a signal transfer function of a residue amplifier generating the amplified residue signal, and (2) a signal transfer function of the VCO ADC back end.

11. The pipelined ADC of claim 9, wherein:
    a ratio of the first filter and the second filter corresponds to: (1) a signal transfer function of a residue amplifier generating the amplified residue signal, (2) a signal transfer function of the VCO ADC back end, and (3) a noise transfer function of the continuous-time residue generation front end.

12. The pipelined ADC of claim 1, wherein:
    the continuous-time residue generation front end comprises:
    a residue amplifier to amplify a residue signal, and to generate the amplified residue signal; and
    circuitry to inject a dither at an input of the residue amplifier; and
    the pipelined ADC further comprises:
    a correlator to cross-correlate the dither and the second digital signal, and to extract: (1) a signal transfer function of a residue amplifier generating the amplified residue signal, and (2) a signal transfer function of the VCO ADC back end.

13. The pipelined ADC of claim 1, wherein the continuous-time residue generation front end comprises:

a quantizer to generate the first digital signal;
an unsampling block to upsample the first digital signal;
a filter to filter an output of the upsampling block; and
a digital-to-analog converter to receive an output of the filter, and to generate a first reconstructed analog signal.

14. The pipelined ADC of claim 13, wherein:
the quantizer operates at a first rate;
the digital-to-analog converter operates at a second rate; and
the second rate is the first rate multiplied an upsampling factor of the upsampling block.

15. The pipelined ADC of claim 1, wherein the VCO ADC back end comprises:
a digital non-linearity correction block to correct non-linearities of the VCO ADC back end.

16. The pipelined ADC of claim 15, wherein the VCO ADC back end comprises:
a replica VCO ADC to process a known signal; and
a calibration unit to derive coefficients of the digital non-linearity correction block based on a digital output of the replica VCO ADC and the known signal.

17. The pipelined ADC of claim 1, wherein the VCO ADC back end comprises:
(1) a first voltage-to-current converter to receive the amplified residue signal;
(2) a first signal path having a first ring oscillator to process a positive signal from the first voltage-to-current converter;
(3) a second signal path having a second ring oscillator to process a negative signal from the first voltage-to-current converter; and
(4) a first node to combine outputs of the first signal path and the second signal path.

18. The pipelined ADC of claim 17, wherein the VCO ADC back end further comprises:
(5) a second voltage-to-current converter to receive the amplified residue signal;
(6) a third signal path having a third ring oscillator to process the positive signal from the second voltage-to-current converter;
(7) a fourth signal path having a fourth ring oscillator to process the negative signal from the second voltage-to-current converter;
(8) a second node to combine outputs of the third signal path and the fourth signal path; and
(9) a third node to combine outputs of the first node and the second node.

19. The pipelined ADC of claim 18, wherein the VCO ADC back end further comprises:
(10) first circuitry to inject dither having a first polarity to the first signal path and the second signal path; and
(11) second circuitry to inject dither having a second polarity opposite to the first polarity to the third signal path and the fourth signal path.

20. The pipelined ADC of claim 1, wherein the VCO ADC back end comprises two injection locked ring oscillators.

21. The pipeline ADC of claim 1, wherein:
the continuous-time residue generation front end is driven by a first clock signal having a first clock frequency; and
the VCO ADC back end is driven by a second clock signal having a second clock frequency that is at least two times the first clock frequency.

22. The pipelined ADC of claim 1, wherein:
the VCO ADC comprises a decimation filter and an anti-aliasing filter.

23. The pipelined ADC of claim 1, wherein the VCO ADC back end comprises:
multiple oscillators; and
one or more feedback paths to implement multi-order noise shaping.

24. The pipelined ADC of claim 1, wherein:
the continuous-time residue generation front end comprises cascaded continuous-time residue generation stages.

25. The pipelined ADC of claim 1, wherein a number of residue generation stages being used to quantize the analog input signal, and to generate the amplified residue signal, is configurable by a controller.

26. The pipelined ADC of claim 1, wherein the VCO ADC back end comprises the following in series: a ring oscillator, a phase-to-digital converter, and a differentiator.

27. A method for pipelined analog-to-digital conversion, comprising:
generating, by a continuous-time front end, a first digital signal representing an analog input signal, and a residue signal representing a difference between a delayed version of the analog input signal and a reconstructed analog signal generated from the first digital signal;
amplifying the residue signal to generate an amplified residue signal;
sampling, by a voltage-controlled-oscillator (VCO) analog-to-digital converter (ADC) back end, phase of the amplified residue signal;
generating, by the VCO ADC back end, a second digital signal based on the phase of the amplified residue signal;
filtering the first digital signal and the second digital signal; and
combining filtered versions of the first digital signal and the second digital signal to generate a final digital output.

28. The method of claim 27, further comprising:
delaying, by a delay circuit, the analog input signal, wherein a response of the delay circuit matches a response of a signal path having a quantizer and a digital-to-analog-converter.

29. The method of claim 27, further comprising:
injecting a dither at an input of a residue amplifier amplifying the residue signal; and
extracting, based on the dither and the second digital signal, a signal transfer function of the residue amplifier, and a signal transfer function of the VCO ADC back end.

30. The method of claim 27, further comprising:
programming one or more of: a first filter to filter the first digital signal, and a second filter to filter the second digital signal, based on a signal transfer function of a residue amplifier amplifying the residue signal, and a signal transfer function of the VCO ADC back end.

31. The method of claim 27, further comprising:
adjusting a number of residue generation stages being used in the continuous-time front end to generate the amplified residue signal.

32. The method of claim 27, further comprising:
driving the continuous-time front end with a first clock signal having a first clock frequency; and
driving the VCO ADC back end with a second clock signal having a second clock frequency that is at least two times the first clock frequency.

33. The method of claim 32, further comprising:
decimating a digital output of the VCO ADC back end; and filtering a decimated version of the digital output of the VCO ADC back end by an anti-aliasing filter to generate the second digital signal.

34. A modular pipelined ADC, comprising:
- a continuous-time residue generation front end to generate an amplified residue signal, wherein the continuous-time residue generation front end comprises a plurality of residue generating stages in cascade;
- a voltage-controlled-oscillator (VCO) ADC back end to quantize the amplified residue signal, and to generate a second digital signal; and
- a digital signal reconstruction filter to filter digital signals from the residue generating stages and the second digital signal, and to generate a final digital signal.

35. The modular pipelined ADC of claim 34, wherein the continuous-time residue generation front end is to quantize an analog input signal, and to generate a plurality of digital signals and the amplified residue signal.

36. The modular pipelined ADC of claim 34, further comprising:
- a controller to re-configure connections for the residue generation stages to change a number of residue generation stages being used to generate the amplified residue signal.

\* \* \* \* \*